US012653018B2

(12) United States Patent
Howder et al.

(10) Patent No.: US 12,653,018 B2
(45) Date of Patent: Jun. 9, 2026

(54) METHODS OF FORMING MICROELECTRONIC DEVICES, AND RELATED MICROELECTRONIC DEVICES, MEMORY DEVICES, AND ELECTRONIC SYSTEMS

(71) Applicant: Micron Technology, Inc., Boise, ID (US)

(72) Inventors: Collin Howder, Boise, ID (US); Yiping Wang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 691 days.

(21) Appl. No.: 17/937,360

(22) Filed: Sep. 30, 2022

(65) Prior Publication Data

US 2024/0113012 A1 Apr. 4, 2024

(51) Int. Cl.
| | |
|---|---|
| *H01L 23/522* | (2006.01) |
| *H01L 21/768* | (2006.01) |
| *H01L 23/532* | (2006.01) |
| *H01L 27/11556* | (2017.01) |
| *H01L 27/11582* | (2017.01) |
| *H10B 41/27* | (2023.01) |
| *H10B 43/27* | (2023.01) |
| *H10W 20/00* | (2026.01) |
| *H10W 20/42* | (2026.01) |
| *H10W 20/47* | (2026.01) |

(52) U.S. Cl.
CPC ............ *H10W 20/42* (2026.01); *H10B 41/27* (2023.02); *H10B 43/27* (2023.02); *H10W 20/081* (2026.01); *H10W 20/082* (2026.01); *H10W 20/083* (2026.01); *H10W 20/47* (2026.01)

(58) Field of Classification Search
CPC ........ H10B 43/27; H10B 41/27; H10B 43/50; H10B 41/50; H01L 21/73832; H01L 21/76832; H01L 21/76381
See application file for complete search history.

(56) References Cited

U.S. PATENT DOCUMENTS

| | | | |
|---|---|---|---|
| 2010/0133598 A1* | 6/2010 | Chae ...................... | H10B 41/27 |
| | | | 257/314 |
| 2017/0117222 A1* | 4/2017 | Kim .................... | H01L 23/5283 |

* cited by examiner

*Primary Examiner* — John A Bodnar
(74) *Attorney, Agent, or Firm* — TraskBritt

(57) ABSTRACT

A microelectronic device comprises a stack structure, a staircase structure, a first liner material, a liner structure, conductive contact structures, and barrier structures. The stack structure comprises vertically alternating conductive structures and insulative structures arranged in tiers. Each of the tiers individually comprises one of the conductive structures and one of the insulative structures. The staircase structure has steps comprising edges of at least some of the tiers of the stack structure. The first liner material is on the steps of the staircase structure, and the liner structure on the first liner material. The conductive contact structures extend through the first liner material and the liner structure and to the conductive structures of the stack structure. The barrier structures are between the conductive contact structures and the liner structure and vertically span substantially the same tiers of the stack structure as the liner structure. Memory devices, electronic systems, and methods of forming microelectronic devices are also described.

23 Claims, 13 Drawing Sheets

1

METHODS OF FORMING MICROELECTRONIC DEVICES, AND RELATED MICROELECTRONIC DEVICES, MEMORY DEVICES, AND ELECTRONIC SYSTEMS

TECHNICAL FIELD

The disclosure, in various embodiments, relates generally to the field of microelectronic device design and fabrication. More specifically, the disclosure relates to methods of forming microelectronic devices, and to related microelectronic devices, memory devices, and electronic systems.

BACKGROUND

A continuing goal of the microelectronics industry has been to increase the memory density (e.g., the number of memory cells per memory die) of memory devices, such as non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes vertical memory strings extending through openings in one or more stack structures including tiers of conductive structures and dielectric materials. Each vertical memory string may include at least one select device coupled in series to a serial combination of vertically-stacked memory cells. Such a configuration permits a greater number of switching devices (e.g., transistors) to be located in a unit of die area (i.e., length and width of active surface consumed) by building the array upwards (e.g., vertically) on a die, as compared to structures with conventional planar (e.g., two-dimensional) arrangements of transistors.

Vertical memory array architectures generally include electrical connections between the conductive structures of the tiers of the stack structure(s) of the memory device and access lines (e.g., word lines) so that the memory cells of the vertical memory array can be uniquely selected for writing, reading, or erasing operations. One method of forming such an electrical connection includes forming so-called "staircase" (or "stair step") structures at edges (e.g., horizontal ends) of the tiers of the stack structure(s) of the memory device. The staircase structure includes individual "steps" defining contact regions of the conductive structures, upon which conductive contact structures can be positioned to provide electrical access to the conductive structures.

Unfortunately, as feature packing densities have increased and margins for formation errors have decreased, conventional methods of forming memory devices (e.g., NAND Flash memory devices) have resulted in undesirable damage that can diminish desired memory device performance, reliability, and durability. For example, conventional processes of forming conductive contact structures on the steps of a staircase structure within a stack structure may punch through conductive structures of the stack structure, resulting in undesirable current leaks and short circuits. Conventional methods of mitigating such punch through include forming dielectric pad structures (e.g., so called "mesa nitride" structures) on sacrificial insulative structures (e.g., dielectric nitride structures) at steps of a staircase structure within a preliminary stack structure prior to subjecting the preliminary stack structure to so called "replacement gate" or "gate last" processing to replace one or more portions of the sacrificial insulative structures with conductive structures and form the stack structure. During the replacement gate processing the dielectric pad structures are also replaced with conductive material to effectively increase thicknesses of portions of the conductive structures at the steps of the staircase structure and mitigate the aforementioned punch through during the subsequent formation of the conductive contact structures. However, the configurations of some staircase structures within a preliminary stack structure may result in undesirable defects (e.g., material inconsistencies, voiding) at the steps of the staircase structure.

BRIEF DESCRIPTION OF THE DRAWINGS

FIGS. 1A-12 are simplified, partial longitudinal cross-sectional views illustrating a microelectronic device structure at different processing stages of a method of forming a microelectronic device, in accordance with embodiments of the disclosure.

DETAILED DESCRIPTION

Figures 1A, 1B:
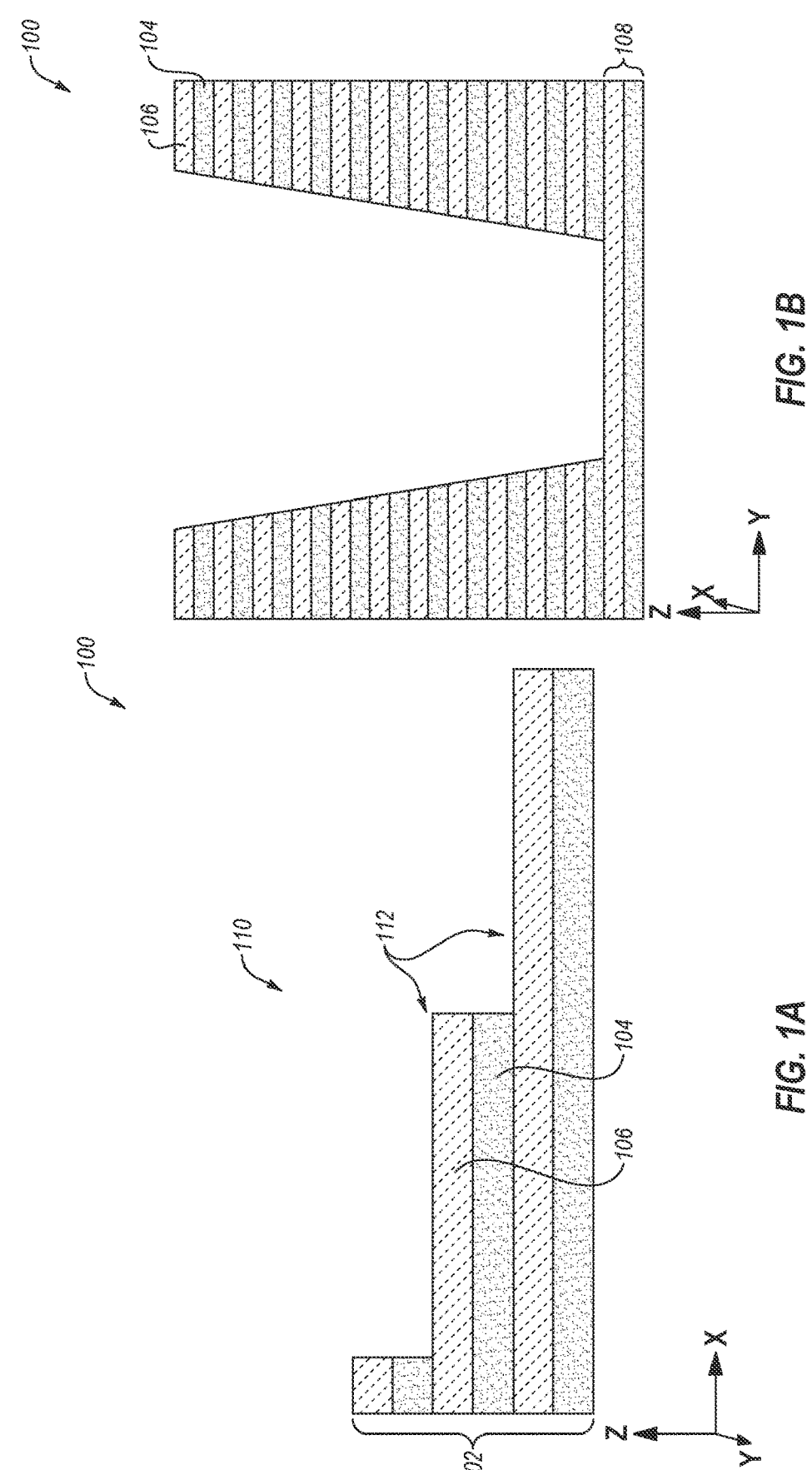

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Embodiments of the disclosure may be practiced in conjunction with conventional microelectronic device fabrication techniques employed in the industry. In addition, the description provided below does not form a complete process flow for manufacturing a microelectronic device (e.g., a memory device, such as 3D NAND Flash memory device). The structures described below do not form a complete microelectronic device. Only those process acts and structures necessary to understand the embodiments of the disclosure are described in detail below. Additional acts to form a complete microelectronic device from the structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, a "memory device" means and includes microelectronic devices exhibiting memory functionality, but not necessarily limited to memory functionality. Stated another way, and by way of non-limiting example only, the term "memory device" includes not only conventional memory (e.g., conventional volatile memory, such as conventional dynamic random access memory (DRAM); conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, the term "configured" refers to a size, shape, material composition, orientation, and arrangement of one or more of at least one structure and at least one apparatus facilitating operation of one or more of the structure and the apparatus in a pre-determined way.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. With reference to the figures, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, features (e.g., regions, structures, devices) described as "neighboring" one another means and includes features of the disclosed identity (or identities) that are located most proximate (e g., closest to) one another. Additional features (e.g., additional regions, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate vertically closest to) one another. Moreover, features described as "horizontally neighboring" one another means and includes features of the disclosed identity (or identities) that are located most horizontally proximate (e.g., horizontally closest to) one another.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the phrase "coupled to" refers to structures operatively connected with each other, such as electrically connected through a direct Ohmic connection or through an indirect connection (e.g., by way of another structure).

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co-and Ni-based alloy, an Fe-and Co-based alloy, a Co-and Ni-and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively doped semiconductor material (e.g., conductively-doped polysilicon, conductively-doped germanium (Ge), conductively-doped silicon germanium (SiGe)). In addition, a "conductive structure" means and includes a structure formed of and including conductive material.

As used herein, "insulative material" means and includes electrically insulative material, such as one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including insulative material.

As used herein, the term "semiconductor material" refers to a material having an electrical conductivity between those of insulative materials and conductive materials. For example, a semiconductor material may have an electrical conductivity of between about $10^{-8}$ Siemens per centimeter (S/cm) and about $10^4$ S/cm ($10^6$ S/m) at room temperature. Examples of semiconductor materials include elements found in column IV of the periodic table of elements such as silicon (Si), germanium (Ge), and carbon (C). Other examples of semiconductor materials include compound semiconductor materials such as binary compound semiconductor materials (e.g., gallium arsenide (GaAs)), ternary compound semiconductor materials (e.g., $Al_xGa_{1-x}As$), and quaternary compound semiconductor materials (e.g., $Ga_xIn_{1-x}As_yP_{1-y}$), without limitation. Compound semiconductor materials may include combinations of elements from columns III and V of the periodic table of elements (III-V semiconductor materials) or from columns II and VI of the periodic table of elements (II-VI semiconductor materials), without limitation. Further examples of semiconductor materials include oxide semiconductor materials such as zinc tin oxide ($Zn_xSn_yO$, commonly referred to as "ZTO"), indium zinc oxide ($In_xZn_yO$, commonly referred to as "IZO"), zinc oxide ($Zn_xO$), indium gallium zinc oxide ($In_xGa_yZn_zO$, commonly referred to as "IGZO"), indium gallium silicon oxide ($In_xGa_ySi_zO$, commonly referred to as "IGSO"), indium tungsten oxide ($In_xW_yO$, commonly referred to as "IWO"), indium oxide ($In_xO$), tin oxide ($Sn_xO$), titanium oxide ($Ti_xO$), zinc oxide nitride ($Zn_xON_z$), magnesium zinc oxide ($Mg_xZn_yO$), zirconium indium zinc oxide ($Zr_xIn_yZn_zO$), hafnium indium zinc oxide ($Hf_xIn_yZn_zO$), tin indium zinc oxide ($Sn_xIn_yZn_zO$), aluminum tin indium zinc oxide ($Al_xSn_yIn_yZn_aO$), silicon indium zinc oxide ($Si_xIn_yZn_zO$), aluminum zinc tin oxide ($Al_xZn_ySn_zO$), gallium zinc tin oxide ($Ga_xZn_ySn_zO$), zirconium zinc tin oxide ($Zr_xZn_ySn_zO$), and other similar materials.

As used herein, the term "homogeneous" means relative amounts of elements included in a feature (e.g., a material, a structure) do not vary throughout different portions (e.g., different horizontal portions, different vertical portions) of the feature. Conversely, as used herein, the term "heterogeneous" means relative amounts of elements included in a feature (e.g., a material, a structure) vary throughout different portions of the feature. If a feature is heterogeneous, amounts of one or more elements included in the feature may vary stepwise (e.g., change abruptly), or may vary continuously (e.g., change progressively, such as linearly, parabolically) throughout different portions of the feature. The feature may, for example, be formed of and include a stack of at least two different materials.

Unless the context indicates otherwise, the materials described herein may be formed by any suitable technique including, but not limited to, spin coating, blanket coating, chemical vapor deposition (CVD), plasma enhanced CVD (PECVD), atomic layer deposition (ALD), plasma enhanced ALD (PEALD), physical vapor deposition (PVD) (e.g., sputtering), or epitaxial growth. Depending on the specific material to be formed, the technique for depositing or growing the material may be selected by a person of ordinary skill in the art. In addition, unless the context indicates otherwise, removal of materials described herein may be accomplished by any suitable technique including, but not limited to, etching (e.g., dry etching, wet etching, vapor etching), ion milling, abrasive planarization (e.g., chemical-mechanical planarization (CMP)), or other known methods.

FIGS. 1A through 12 are simplified, longitudinal partial cross-sectional views illustrating a microelectronic device structure at different processing stages of a method of forming a microelectronic device (e.g., a memory device, such as a 3D NAND Flash memory device), in accordance with embodiments of the disclosure. With the description provided below, it will be readily apparent to one of ordinary skill in the art that the methods described herein may be used for forming various devices. In other words, the methods of the disclosure may be used whenever it is desired to form a microelectronic device.

Referring to FIGS. 1A and 1B, a microelectronic device structure 100 may be formed to include a preliminary stack structure 102. The preliminary stack structure 102 includes a vertically alternating (e.g., in the Z-direction) sequence of insulative material 104 and sacrificial material 106 arranged in tiers 108. Each of the tiers 108 of the preliminary stack structure 102 may include the insulative material 104 vertically neighboring the sacrificial material 106. The preliminary stack structure 102 may be formed to include any desired number of the tiers 108, such as greater than or equal to sixteen (16) tiers 108, greater than or equal to thirty-two (32) tiers 108, greater than or equal to sixty-four (64) tiers 108, greater than or equal to one hundred twenty-eight (128) tiers 108, or greater than or equal to two hundred fifty-six (256) tiers 108.

The insulative material 104 of the tiers 108 of the preliminary stack structure 102 may be formed of and include at least one dielectric material, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). In some embodiments, the insulative material 104 of the tiers 108 of the preliminary stack structure 102 is formed of and includes silicon dioxide ($SiO_2$). The insulative material 104 of each of the tiers 108 may be substantially the same (e.g., exhibit substantially the same material composition, material distribution, size, and shape) as the insulative material 104 of each other the tiers 108, or at least one of the insulative material 104 of at least one of the tiers 108 may be different (e.g., exhibit one or more of a different material composition, a different material distribution, a different size, and a different shape) than the insulative material 104 of at least one other of the tiers 108. In some embodiments, the insulative material 104 of each of the tiers 108 is substantially the same as the insulative material 104 of each other of the tiers 108.

The sacrificial material 106 of the tiers 108 of the preliminary stack structure 102 may be formed of and include at least one material (e.g., at least one dielectric material) that may be selectively removed relative to the insulative material 104 of the tiers 108 of the preliminary stack structure 102. The sacrificial material 106 may be selectively etchable relative to the insulative material 104 during common (e.g., collective, mutual) exposure to a first etchant, and the insulative material 104 may be selectively etchable to the sacrificial material 106 during common exposure to a second, different etchant. As used herein, a material is "selectively etchable" relative to another material if the material exhibits an etch rate that is at least about five times (5×) greater than the etch rate of another material, such as about ten times (10×) greater, about twenty times (20×) greater, or about forty times (40×) greater. A material composition of the sacrificial material 106 is different than a material composition of the insulative material 104. As a non-limiting example, the sacrificial material 106 of the tiers 108 of the preliminary stack structure 102 may comprise an additional dielectric material, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). In some embodiments, the sacrificial material 106 of the tiers 108 of the preliminary stack structure 102 is formed of and includes a dielectric nitride material, such as $SiN_y$ (e.g., $Si_3N_4$). The sacrificial material 106 of each of the tiers 108 may be substantially the same (e.g., exhibit substantially the same material composition, material distribution, size, and shape) as the sacrificial material 106 of each other the tiers 108, or at least one of the sacrificial material 106 of at least one of the tiers 108 may be different (e.g., exhibit one or more of a different material composition, a different material distribution, a different size, and a different shape) than the sacrificial material 106 of at least one other of the tiers 108. In some embodiments, the sacrificial material 106 of each of the tiers 108 is substantially the same as the sacrificial material 106 of each other of the tiers 108.

With continued reference to FIGS. 1A and 1B, the microelectronic device structure 100 may further include at least one staircase structure 110 including steps 112 (e.g., contact regions) defined by edges (e.g., horizontal ends) of the tiers 108. The staircase structure 110 may include a desired quantity of the steps 112. As shown in FIG. 1A, in some embodiments, the steps 112 of the staircase structure 110 are arranged in order, such that steps 112 horizontally neighboring one another in the X-direction correspond to tiers 108 of the preliminary stack structure 102 vertically neighboring one another in the Z-direction. In additional embodiments, the steps 112 of the staircase structure 110 are arranged out of order, such that at least some steps 112 of the staircase structure 110 horizontally neighboring one another in the X-direction correspond to tiers 108 of preliminary stack structure 102 not vertically neighboring one another in the Z-direction.

The preliminary stack structure 102 may include a desired quantity and distribution (e.g., spacing and arrangement) of staircase structures 110. The preliminary stack structure 102 may include a single (e.g., only one) staircase structure 110, or may include multiple (e.g., more than one) staircase structures 110. If the preliminary stack structure 102 includes multiple staircase structures 110, each of the staircase structures 110 may be positioned at a different vertical location (e.g., in the Z-direction) within the preliminary stack structure 102, or at least one of the staircase structures 110 may be positioned at substantially the same vertical location (e.g., in the Z-direction) within the preliminary stack structure 102 as at least one other of the staircase structures 110. If multiple staircase structures 110 are positioned at substantially the same vertical location (e.g., in the Z-direction) within the preliminary stack structure 102, the staircase structures 110 may be horizontally positioned in series with one another, in parallel with one another, or a combination thereof. If multiple staircase structures 110 at substantially the same vertical location (e.g., in the Z-direction) (if any) within the preliminary stack structure 102 are horizontally positioned in series with one another, each of the staircase structures 110 may exhibit a positive slope, each of the staircase structures 110 may exhibit a negative slope, or at least one of the staircase structures 110 may exhibit a positive slope and at least one other of the staircase structures 110 may exhibit a negative slope. For example, the preliminary stack structure 102 may include one or more stadium structures individually comprising a first staircase structure 110 having positive slope, and a second staircase structure 110 horizontally neighboring and in series with the first staircase structure 110 and having negative slope.

Figures 2A, 2B:
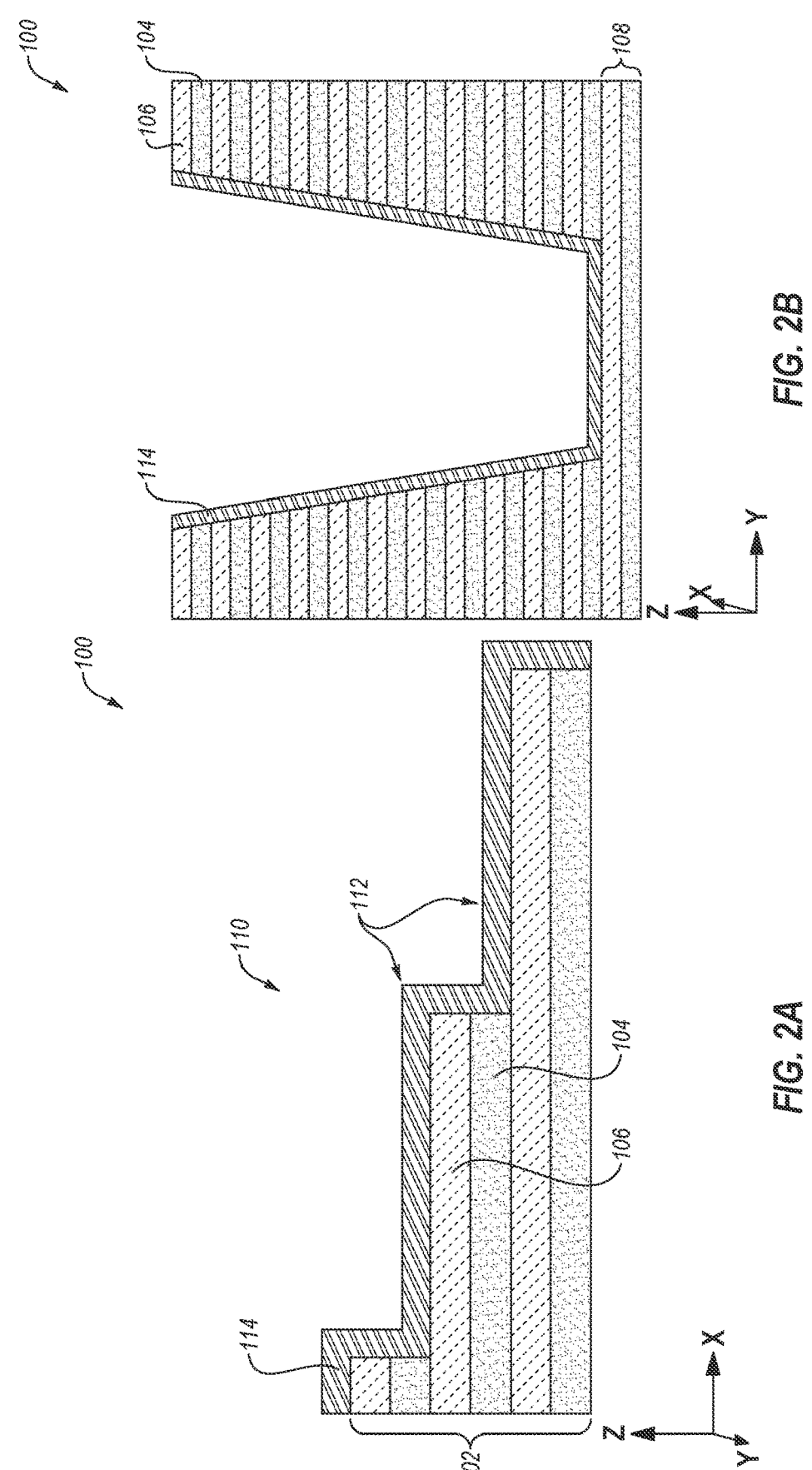

Referring next to FIGS. 2A and 2B, a first liner material 114 may be formed on or over exposed surfaces of the preliminary stack structure 102. As shown in FIG. 2B, the first liner material 114 may be formed on or over exposed surfaces (e.g., exposed horizontal surfaces, exposed vertical surfaces) of the preliminary stack structure 102 at least partially defining the staircase structure 110. Optionally, the first liner material 114 may also be formed on or over additional exposed surfaces (e.g., exposed horizontally extending surfaces, exposed vertically extending surfaces) of the preliminary stack structure 102 outside of the boundaries (e.g., horizontal boundaries, vertical boundaries) of the staircase structure 110. The first liner material 114 may at least partially (e.g., substantially) conform to a topography defined by the surfaces (e.g., horizontal surfaces, vertical surfaces) upon which the first liner material 114 is formed.

The first liner material 114 may be formed of and include at least one material having different etch selectivity than the sacrificial material 106 of the preliminary stack structure 102. Following additional processing, portions of the first liner material 114 may be employed to protect portions of a stack structure formed from the preliminary stack structure 102 during subsequent processing acts (e.g., subsequent material removal acts, such as subsequent etching acts), as described in further detail below. As a non-limiting example, the first liner material 114 may comprise at least one oxygen-containing dielectric material, such as a one or more of a dielectric oxide material (e.g., $SiO_x$, phosphosilicate glass, borosilicate glass, borophosphosilicate glass, fluorosilicate glass, $AlO_x$, $HfO_x$, $NbO_x$, $TiO_x$), a dielectric oxynitride material (e.g., $SiO_xN_y$), and a dielectric carboxynitride material (e.g., $SiO_xC_zN_y$). In some embodiments, the first liner material 114 is formed of and includes $SiO_x$ (e.g., $SiO_2$). In additional embodiments, the first liner material 114 is formed of and includes an oxide of a metal material. The first liner material 114 may be substantially homogeneous, or the first liner material 114 may be heterogeneous.

The first liner material 114 may be formed to exhibit a desirable thickness less than the horizontal dimension (e.g., width) in the X-direction of the individual steps 112 of the staircase structure 110. The thickness of the first liner material 114 may, for example, be less than or equal to half of a width in the X-direction of a horizontally smallest step 112 of the staircase structure 110. By way of non-limiting example, the thickness of the first liner material 114 may be within a range of from about 5 nanometers (nm) to about 1000 nm. In some embodiments, a thickness of the first liner material 114 is less than a thickness of the insulative material 104 of an individual tier 108 of the preliminary stack structure 102.

The first liner material 114 may be formed using conventional processes (e.g., conventional conformal deposition processes, such as one or more of a conventional conformal CVD process and a conventional ALD process; conventional oxidation processes) and conventional processing equipment, which are not described in detail herein.

Figures 3A, 3B:
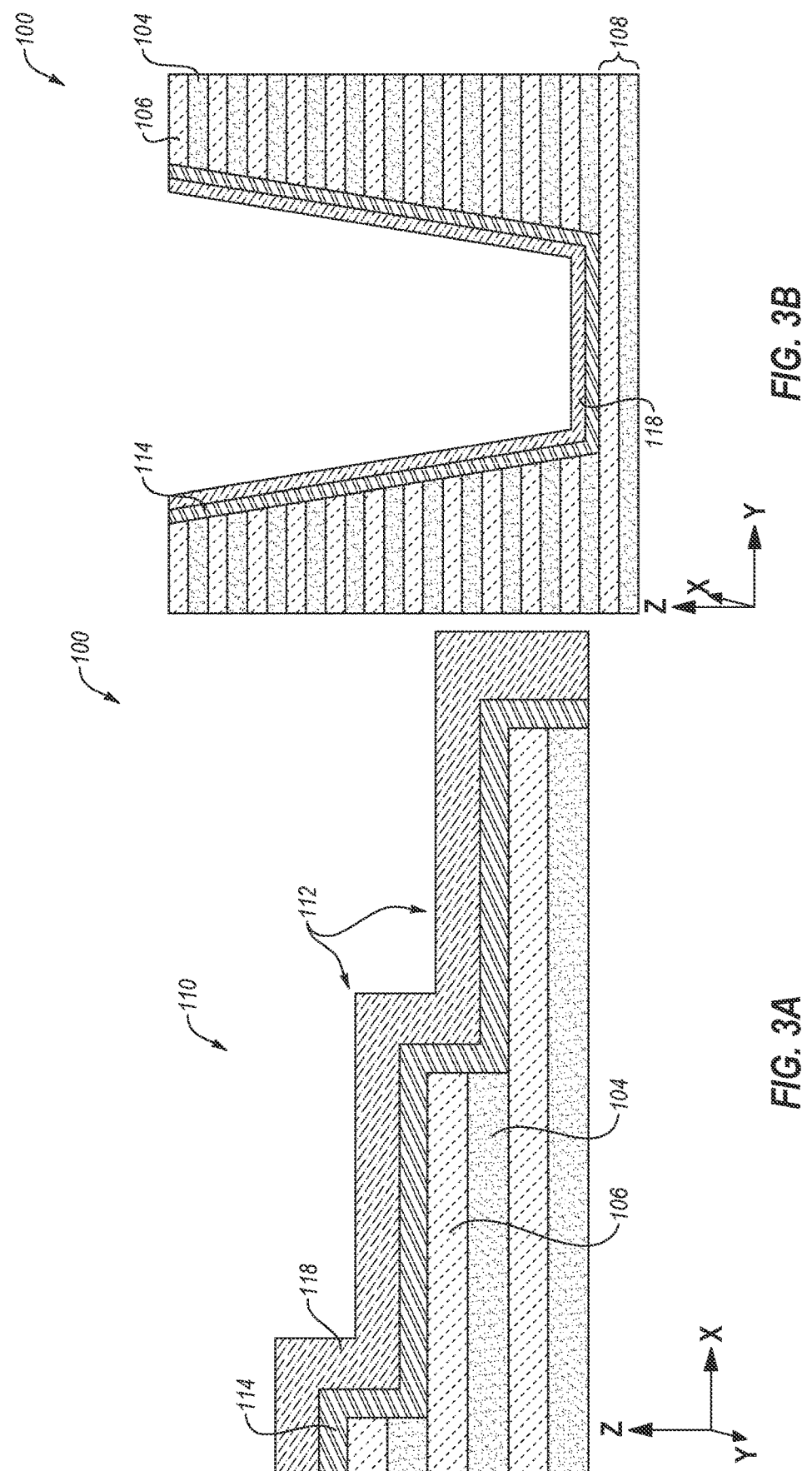

Referring next to FIGS. 3A and 3B, a second liner material 118 may be formed on or over the first liner material 114. The second liner material 118 may be formed on surfaces of the first liner material 114. The second liner material 118 may be formed to cover exposed horizontally extending surfaces and exposed vertically extending surfaces of the first liner material 114 of the microelectronic device structure 100 inside of and outside of boundaries (e.g., horizontal boundaries, vertical boundaries) of the staircase structure 110. The second liner material 118 may at least partially (e.g., substantially) conform to a topography defined by the surfaces (e.g., horizontal surfaces, vertical surfaces) upon which the second liner material 118 is formed.

The second liner material 118 may be formed of and include at least one material having different etch selectivity than the first liner material 114. The second liner material 118 may also have, or may subsequently be further processed (e.g., doped) to have, different etch selectivity than the sacrificial material 106 of the preliminary stack structure 102. Following additional processing, portions of the second liner material 118 may be employed to protect portions of the stack structure formed from the preliminary stack structure 102 during subsequent processing acts (e.g., subsequent material removal acts, such as subsequent etching acts), as described in further detail below. In some embodiments, the second liner material 118 is formed of and includes polycrystalline silicon. As a non-limiting example, the second liner material 118 may be formed of and include at least one semiconductive material, such as one or more of a silicon material, a silicon-germanium material, a boron material, a germanium material, a gallium arsenide material, a gallium nitride material, and an indium phosphide material. The second liner material 118 may, for example, be formed of and include at least one silicon material. As used herein, the term "silicon material" means and includes a material that includes elemental silicon or a compound of silicon. As an additional non-limiting example, the second liner material 118 may be formed of and include one or more of at least one insulative material (e.g., a dielectric oxide material, a dielectric nitride material, a dielectric oxynitride material, a dielectric carboxynitride material), and at least one conductive material (e.g., a metal, an alloy, a conductive metal-containing material). In additional embodiments, the second liner material 118 is formed of and includes a dielectric oxide material (e.g., $SiO_x$, such as $SiO_2$). In further embodiments, the second liner material 118 is formed of and includes a dielectric nitride material (e.g., $SiN_y$, such as $Si_3N_4$). The second liner material 118 may be substantially homogeneous, or the second liner material 118 may be heterogeneous.

The second liner material 118 may be formed to exhibit a desirable thickness in each of the Z-direction and the X-direction. The thickness of the second liner material 118 in the Z-direction may, for example, be between about 35 nm and about 80 nm. As a non-limiting example, the second liner material 118 may have a thickness in the Z-direction of about 50 nm. As is described in greater detail below, a thickness of the second liner material 118 in the Z-direction and the X-direction may selected (e.g., formed to exhibit a desirable thickness) to ultimately provide a particular isolation distance between the second liner material 118 and later-formed metal contacts (e.g., FIG. 12).

The second liner material 118 may be formed using one or more conventional conformal deposition processes, such as one or more of a conventional conformal CVD process and a conventional ALD process.

Figures 4A, 4B:
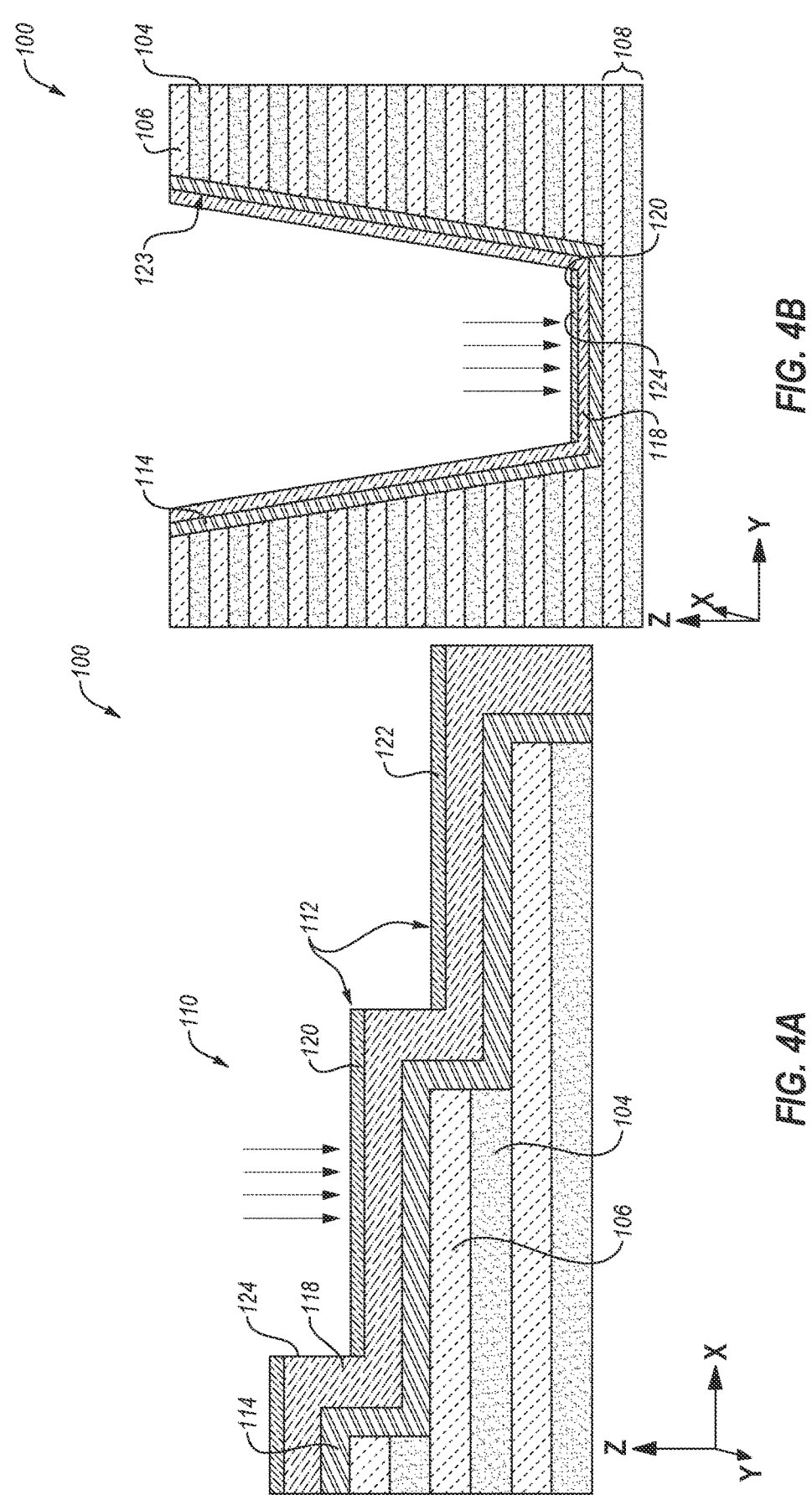

Referring next to FIGS. 4A and 4B, horizontal surfaces of the second liner material 118 may be doped (e.g., impregnated, implanted) with one or more dopants (e.g., chemical species) to form a doped second liner material 120. Furthermore, in some embodiments, only horizontal surfaces of the second liner material 118 are doped, and at least some portions of vertical surfaces of the second liner material 118 remain undoped (e.g., free of the one or more dopants), as depicted in FIGS. 4A and 4B. For example, vertical surfaces of the second liner material 118 between steps 112 of the at least one staircase structure 110 of the microelectronic device structure 100 and vertical surfaces of the second liner material 118 on sidewalls 123 of the preliminary stack structure 102 horizontally bounding the at least one staircase structure 110 (e.g., vertical surfaces facing and on lateral sides of the at least one staircase structure 110 in the Y-direction) may remain undoped. As shown in FIG. 4A, the doped second liner material 120 may form horizontally extending portions 122 that are vertically separated by undoped vertically extending portions 124 of the second liner material 118. For example, each step 112 of a given staircase structure 110 may have a respective horizontally extending portion 122 of doped second liner material 120 that is vertically separated from horizontally extending portions 122 of doped second liner material 120 of vertically neighboring steps of the given staircase structure 110. Together, the doped second liner material 120 (e.g., the horizontally extending portions 122) and any remaining undoped second liner material 118 may form a liner structure.

A vertical depth (e.g., in the Z-direction) of the dopant(s) (e.g., a vertical depth of the horizontally extending portions 122 of the doped second liner material 120 within the second liner material 118 may be at least about 5.0 nm). In some embodiments, only a portion of the second liner material 118 (e.g., a portion of the vertical thickness of the second liner material 118) is doped with the one or more dopants. In additional embodiments, one or more horizontally extending portions 122 of the doped second liner material 120 have substantially a same vertical thickness as the second liner material 118 beneath a respective horizontal surface of the second liner material 118. In view of the foregoing, a vertical depth (e.g., a vertical in the Z-direction) of the dopant(s) within the second liner material 118 (e.g., a vertical thickness of the horizontally extending portions 122 of the doped second liner material 120) may be at least substantially the same as a thickness of the second liner material 118 beneath a respective horizontal surface of the second liner material 118.

The dopant(s) of the doped second liner material 120 may comprise material(s) promoting or facilitating selective removal of undoped portions of the second liner material 118 relative to the horizontally extending portions 122 of the doped second liner material 120 and/or the first liner material 114. Depending on a material composition of the second liner material 118, the dopant(s) may, for example, comprise one or more of boron (B), carbon (C), at least one N-type dopant (e.g., one or more of phosphorus (P), arsenic (As), antimony (Sb), and bismuth (Bi)), at least one other P-type dopant (e.g., a P-type dopant other than B, such as aluminum (Al) and/or gallium (Ga)), nitrogen (N), oxygen (O), fluorine (F), chlorine (Cl), bromine (Br), hydrogen (H), deuterium (C H), helium (He), neon (Ne), and argon (Ar). In some embodiments, such as some embodiments wherein the second liner material 118 comprises one or more of polycrystalline silicon, a dielectric oxide material (e.g., $SiO_x$), and a dielectric nitride material (e.g., $SiN_y$), the dopant comprises carbon (C). In embodiments where the second liner material 118 comprises one or more of polycrystalline silicon or a dielectric oxide material (e.g., $SiO_x$), the dopant may comprise boron (B).

The horizontally extending portions 122 of the doped second liner material 120 may individually exhibit a substantially homogeneous distribution of dopant(s) within the material thereof, or may individually exhibit a heterogeneous distribution of dopant(s) within the material thereof. In some embodiments, each of the horizontally extending portions 122 of the doped second liner material 120 exhibits a substantially homogeneous distribution of dopant(s) within the material thereof, such that the horizontally extending portion 122 exhibits a substantially uniform (e.g., even, non-variable) distribution of the dopant(s) within the material thereof. For example, amounts (e.g., atomic concentrations) of the dopant(s) included in each individual horizontally extending portion 122 of the doped second liner material 120 may not substantially vary throughout the vertical dimensions (e.g., in the Z-direction) of the horizontally extending portion 122. In additional embodiments, one or more (e.g., each) of the horizontally extending portions 122 of the doped second liner material 120 exhibits a substantially heterogeneous distribution of dopant(s) within the material thereof, such that the horizontally extending portion(s) 122 exhibit a substantially non-uniform (e.g., non-even, variable) distribution of the dopant(s) within the material thereof. For example, amounts (e.g., atomic concentrations) of the dopant(s) included in each individual horizontally extending portion 122 of the doped second liner material 120 may vary (e.g., increase, decrease) throughout a vertical dimension (e.g., in the Z-direction) of the horizontally extending portion 122.

The second liner material 118 may be doped with at least one dopant to form the doped second liner material 120 using conventional processes (e.g., conventional implantation processes, conventional diffusion processes), which are not described in detail herein. As a non-limiting example, one or more boron-containing species (e.g., boron atoms, boron-containing molecules, boron ions, boron-containing ions) may be implanted into the second liner material 118 to form the doped second liner material 120. As another non-limiting example, one or more carbon-containing species (e.g., carbon atoms, carbon-containing molecules, carbon ions, carbon-containing ions) may be implanted into the second liner material 118 to form the doped second liner material 120. In some embodiments, following dopant implantation, an amount of dopant within at least the horizontally extending portions 122 of the doped second liner material 120 is within a range of from about $1.0 \times 10^{15}$ dopant atoms per cubic centimeter ($cm^3$) to about $1.0 \times 10^{25}$ dopant atoms/$cm^3$.

Figures 5A, 5B:
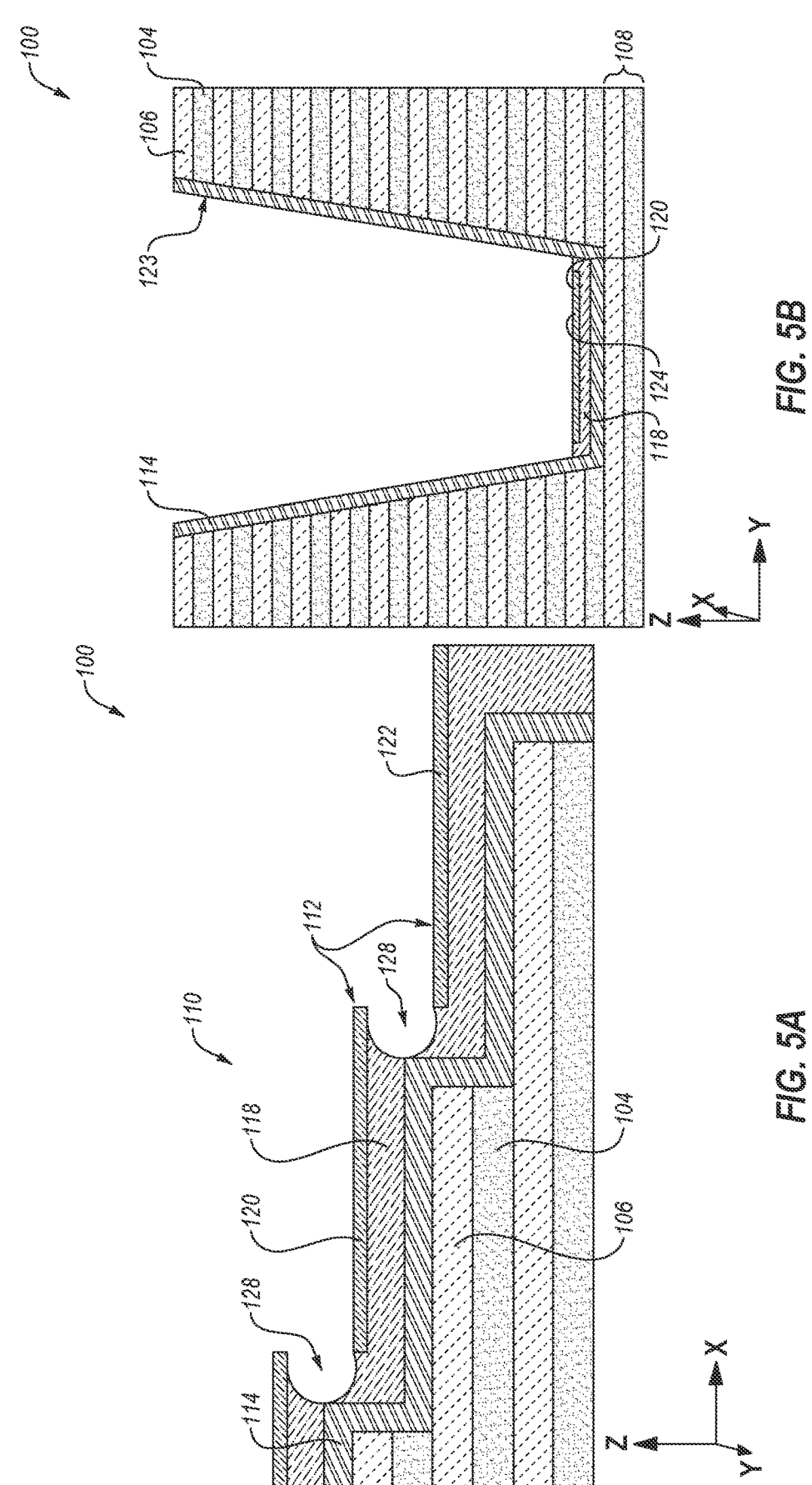

Referring next to FIGS. 5A and 5B, portions of the second liner material 118 disposed over the sidewalls 123 of the preliminary stack structure 102 horizontally bounding the steps 112 of the at least one staircase structure 110 and extending substantially vertically up from the first liner material 114 may be substantially removed to expose vertically and/or substantially vertically extending surfaces of the first liner material 114.

As shown in FIG. 5A, selective removal of the portions of the second liner material 118 disposed on the sidewalls 123 of the preliminary stack structure 102 horizontally bounding the at least one staircase structure 110 may form air gaps 128 intervening between vertically neighboring horizontally extending portions 122 of the doped second liner material 120. For example, selective removal of the portions of the second liner material 118 disposed on the sidewalls 123 of the preliminary stack structure 102 horizontally bounding the at least one staircase structure 110 may result in portions of the second liner material 118 exposed between vertically neighboring horizontally extending portions 122 of the doped second liner material 120 to be removed (e.g., etched). The removed portions of the second liner material 118 exposed between neighboring horizontally extending portions 122 of the doped second liner material 120 may define the air gaps 128.

The air gaps 128 may each individually vertically extend (e.g., in the Z-direction) from a lower vertical boundary (e.g., a lower surface) of a relatively vertically higher horizontally extending portion 122 of the doped second liner material 120 to or beyond an upper vertical boundary (e.g., an upper surface) of a relatively vertically lower horizontally extending portions 122 of the doped second liner material 120 horizontally neighboring the relatively vertically higher horizontally extending portion 122 of the doped second liner material 120. In addition, the air gaps 128 may each individually horizontally extend (e.g., in the X-direction) from a horizontal boundary (e.g., a side surface) of one of the upper horizontally extending portions 122 of the doped second liner material 120 to a horizontal boundary (e.g., a vertically extending surface) of a portion of the first liner material 114 horizontally neighboring the horizontally extending portion 122 of the doped second liner material 120. In some embodiments, the air gaps 128 do not horizontally extend (e.g., in the X-direction) completely to the portion of the first liner material 114 horizontally neighboring the relatively vertically higher horizontally extending portion 122 of the doped second liner material 120. In embodiments where a vertical depth (e.g., a vertical depth in the Z-direction) of the dopant(s) within the second liner material 118 (e.g., a vertical thickness of the horizontally extending portions 122 of the doped second liner material 120) is at least substantially the same as a thickness of the second liner material 118 beneath a respective horizontal surface of the second liner material 118, the air gaps 128 may not be formed.

Referring still to FIGS. 5A and 5B, portions of the second liner material 118 disposed on the sidewalls 123 of the preliminary stack structure 102 horizontally bounding the at least one staircase structure 110 and extending substantially vertically up from the at least one staircase structure 110 and portions of the second liner material 118 exposed between vertically neighboring horizontally extending portions 122 of the doped second liner material 120 may be removed by treating the second liner material 118 with at least one etchant (e.g., wet etchant). By way of non-limiting example, depending on the material composition of the second liner material 118, the etchant may comprise one or more of tetramethylammonium hydroxide (TMAH), hydrofluoric acid (HF), a buffered oxide etchant (BOE), or nitric acid (HNO$_3$). In additional embodiments, the material removal process includes treating the microelectronic device structure 100 with a solution including water and HF at a ratio within a range of from about 500:1 to about 100:1. The second liner material 118 may be exposed to the etchant using conventional processes (e.g., a spin-coating process, a spray-coating process, an immersion-coating process, a vapor-coating process, a soaking process, combinations thereof) and conventional processing equipment, which are not described in detail herein.

Figures 6A, 6B:
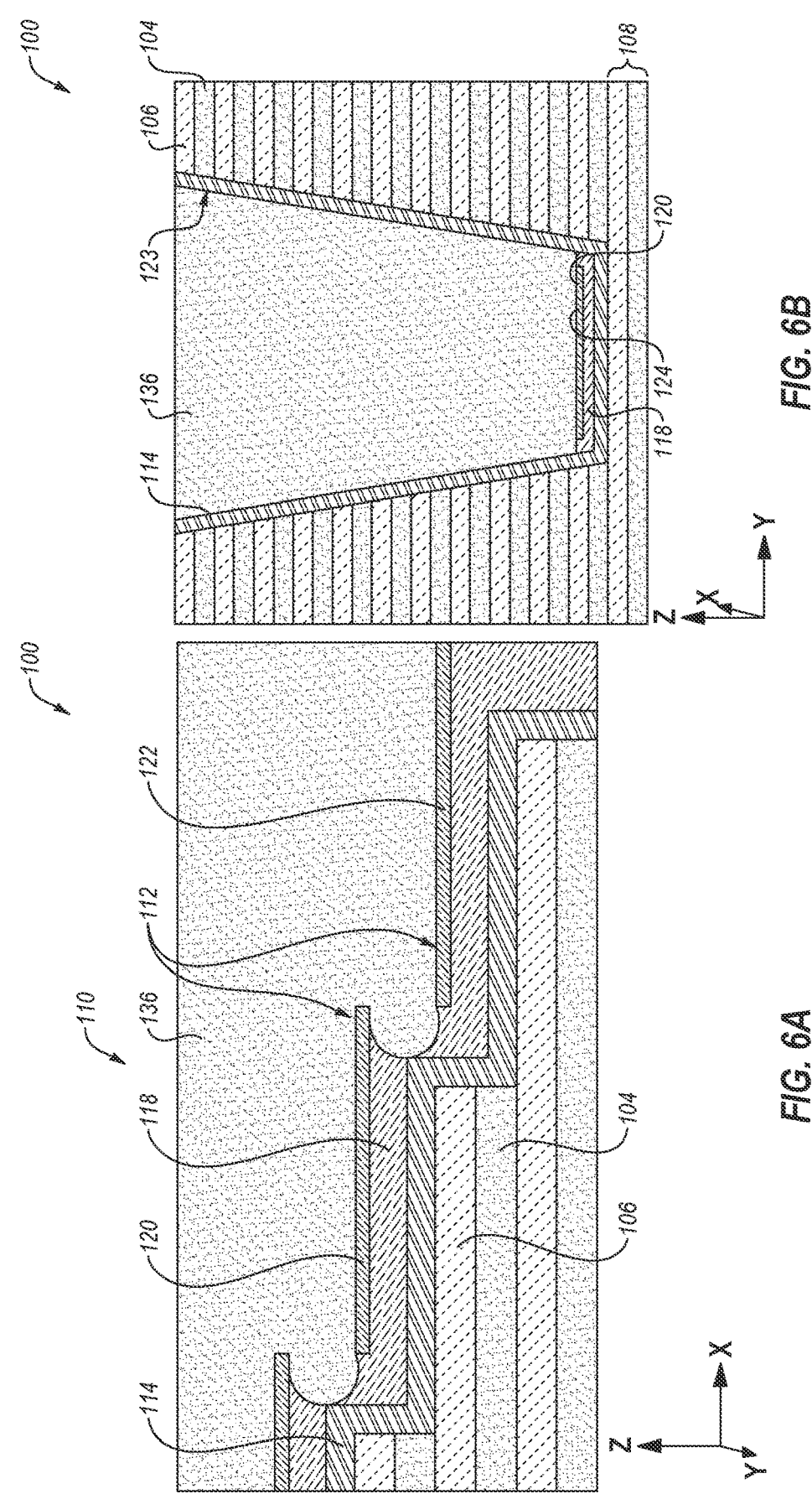

Referring next to FIGS. 6A and 6B, an isolation material 136 may be formed on or over the preliminary stack structure 102, the staircase structure 110, and the horizontally extending portions 122 of the doped second liner material 120. As shown in FIG. 6A, the isolation material 136 may substantially fill the air gaps 128 (FIG. 5A), and may also extend across and cover surfaces of the horizontally extending portions 122 of the doped second liner material 120 and the steps 112 of the staircase structure 110 (including any exposed surfaces of the second liner material 118). The isolation material 136 may be formed to have a substantially planar upper boundary, and a non-planar lower boundary complementary (e.g., substantially mirroring) to the topography thereunder.

The isolation material 136 may be formed of and include at least one dielectric material, such as one or more of at least one dielectric oxide material (e.g., one or more of SiO$_x$, phosphosilicate glass, borosilicate glass, borophosphosilicate glass, fluorosilicate glass, AlO$_x$, HfO$_x$, NbO$_x$, TiO$_x$, ZrO$_x$, TaO$_x$, and MgO$_x$), at least one dielectric nitride material (e.g., SiN$_y$), at least one dielectric oxynitride material (e.g., SiO$_x$N$_y$), and at least one dielectric carboxynitride material (e.g., SiO$_x$C$_z$N$_y$). A material composition of the isolation material 136 is different than a material composition of the sacrificial material 106 of the tiers 108 of the preliminary stack structure 102. The material composition of the isolation material 136 may be substantially the same as or may be different than a material composition of the insulative material 104 of the tiers 108 of the preliminary stack structure 102. In some embodiments, the isolation material 136 is formed of and includes SiO$_2$. The isolation material 136 may be substantially homogeneous, or may be heterogeneous.

Figure 7:
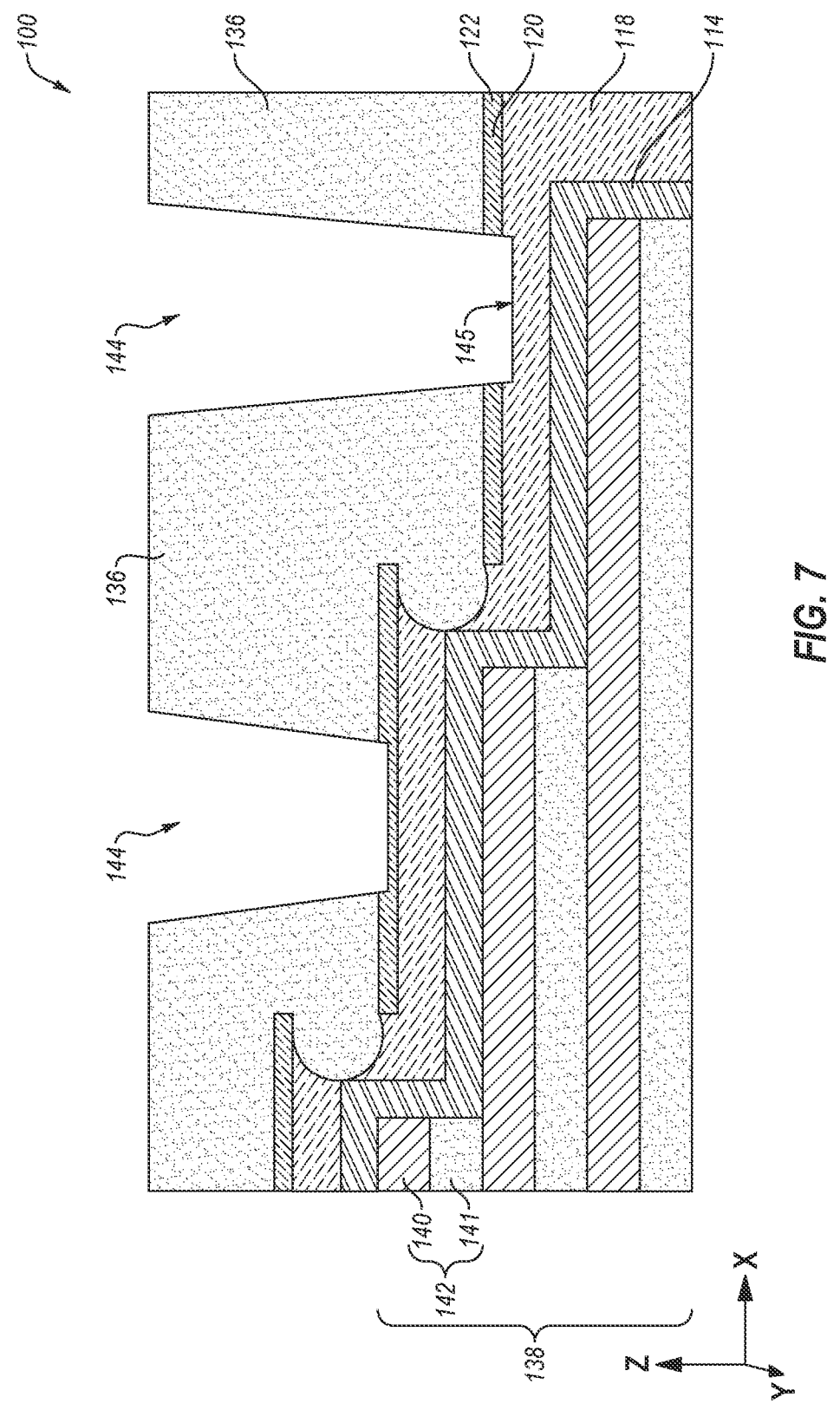

Referring next to FIG. 7, following the formation of the isolation material 136, the microelectronic device structure 100 may be subjected to replacement gate processing to at least partially replace the sacrificial material 106 (FIG. 6A) of the tiers 108 (FIG. 6A) of the preliminary stack structure 102 (FIG. 6A) with conductive structures 140 and form a stack structure 138. Thereafter, portions of the isolation material 136 may be removed, to form initial contact openings 144 vertically extending through the isolation material 136 and to or through the horizontally extending portions 122 of the doped second liner material 120.

As shown in FIG. 7, the stack structure 138 is formed to include a vertically alternating (e.g., in the Z-direction) sequence of the conductive structures 140 and insulative structures 141 arranged in tiers 142. Each of the tiers 142 of the stack structure 138 includes at least one of the conductive structures 140 vertically neighboring at least one of the insulative structures 141. The conductive structures 140 may be formed of and include at least one conductive material, such as one or more of a metal, an alloy, a conductive metal oxide, a conductive metal nitride, a conductive metal silicide, and a conductively doped semiconductor material. In some embodiments, the conductive structures 140 are formed of and include W. The insulative structures 141 may comprise portions of the insulative material 104 (FIG. 6A) of the tiers 108 (FIG. 6A) of the preliminary stack structure 102 (FIG. 6A) remaining (e.g., unremoved) following the replacement gate processing. In some embodiments, the insulative structures 141 are formed of and include SiO$_2$.

During replacement gate processing, the preliminary stack structure 102 (FIG. 6A) may be subjected to a material removal process to selectively remove (e.g., selectively exhume) at least a portion (e.g., all, less than all) of the sacrificial material 106 (FIG. 6A) of the tiers 108 (FIG. 6A) of the preliminary stack structure 102 (FIG. 6A) relative to the insulative material 104 (FIG. 6A) of the tiers 108 (FIG. 6A). For example, slots (e.g., slits, openings, trenches) may be formed to vertically extend (e.g., in the Z-direction) through the preliminary stack structure 102 (FIG. 6A), and then portions of the sacrificial material 106 (FIG. 6A) may be selectively removed through the slots using one or more etchants. Thereafter, open volumes (e.g., void spaces) formed by the removed portions of the sacrificial material 106 (FIG. 6A) may be filled with conductive material (e.g., W) to form the conductive structures 140.

Still referring to FIG. 7, the initial contact openings 144 may be formed to vertically extend through the isolation material 136 and expose (e.g., uncover) portions of the second liner material 118 (e.g., the horizontally extending portions 122 of the doped second liner material 120 and/or regions of the second liner material 118 that remain undoped). The initial contact openings 144 may vertically terminate at a bottom surface 145 at or within the second liner material 118. In some embodiments, one or more of the initial contact openings 144 are formed to terminate at or within the horizontally extending portions 122 of the doped second liner material 120. In additional embodiments, one or more of the initial contact openings 144 are formed to terminate at or within the regions of the second liner material 118 that remain undoped. The second liner material 118 and the horizontally extending portions 122 of the doped second liner material 120 (e.g., the liner structure) may serve as so-called "etch stop" structures to mitigate (e.g., prevent) undesirable damage (e.g., over-etching damage, punch-through damage) to the tiers 142 of the stack structure 138 during the formation of the initial contact openings 144.

Each initial contact opening 144 may individually be formed at a desired horizontal position (e.g., in the X-direction and the Y-direction) within a horizontal area of one of the second liner material 118 and/or the horizontally extending portions 122 of the doped second liner material 120. The initial contact opening 144 may be positioned within a horizontal area of a step 112 of the staircase structure 110 in physical contact with the second liner material 118. In some embodiments, within a horizontal area of the staircase structure 110, the initial contact openings 144 are substantially horizontally aligned with one another in the Y-direction. In additional embodiments, within the horizontal area of the staircase structure 110, at least some of the initial contact openings 144 are horizontally offset in the Y-direction from at least some other of the initial contact openings 144.

The initial contact openings 144 may each individually be formed to exhibit a desired horizontal cross-sectional shape. In some embodiments, each of the initial contact openings 144 is formed to exhibit a substantially circular horizontal cross-sectional shape. In additional embodiments, one or more (e.g., each) of the initial contact openings 144 is formed to exhibit a non-circular cross-sectional shape, such as one more of an oblong cross-sectional shape, an elliptical cross-sectional shape, a square cross-sectional shape, a rectangular cross-sectional shape, a tear drop cross-sectional shape, a semicircular cross-sectional shape, a tombstone cross-sectional shape, a crescent cross-sectional shape, a triangular cross-sectional shape, a kite cross-sectional shape, and an irregular cross-sectional shape. In addition, each of the initial contact openings 144 may be formed to exhibit substantially the same horizontal cross-sectional dimensions (e.g., substantially the same horizontal diameter), or at least one of the initial contact openings 144 may be formed to exhibit one or more different horizontal cross-sectional dimensions (e.g., a different horizontal diameter) than at least one other of the initial contact openings 144. In some embodiments, all of the initial contact openings 144 are formed to exhibit substantially the same horizontal cross-sectional dimensions.

The initial contact openings 144 may be formed using a conventional process (e.g., conventional material removal processes, such as conventional etching processes) and conventional processing equipment, which are not described in detail herein. As a non-limiting example, the initial contact openings 144 may be formed using anisotropic dry etching, such as one or more of RIE, deep RIE, plasma etching, reactive ion beam etching, and chemically assisted ion beam etching.

Figure 8:
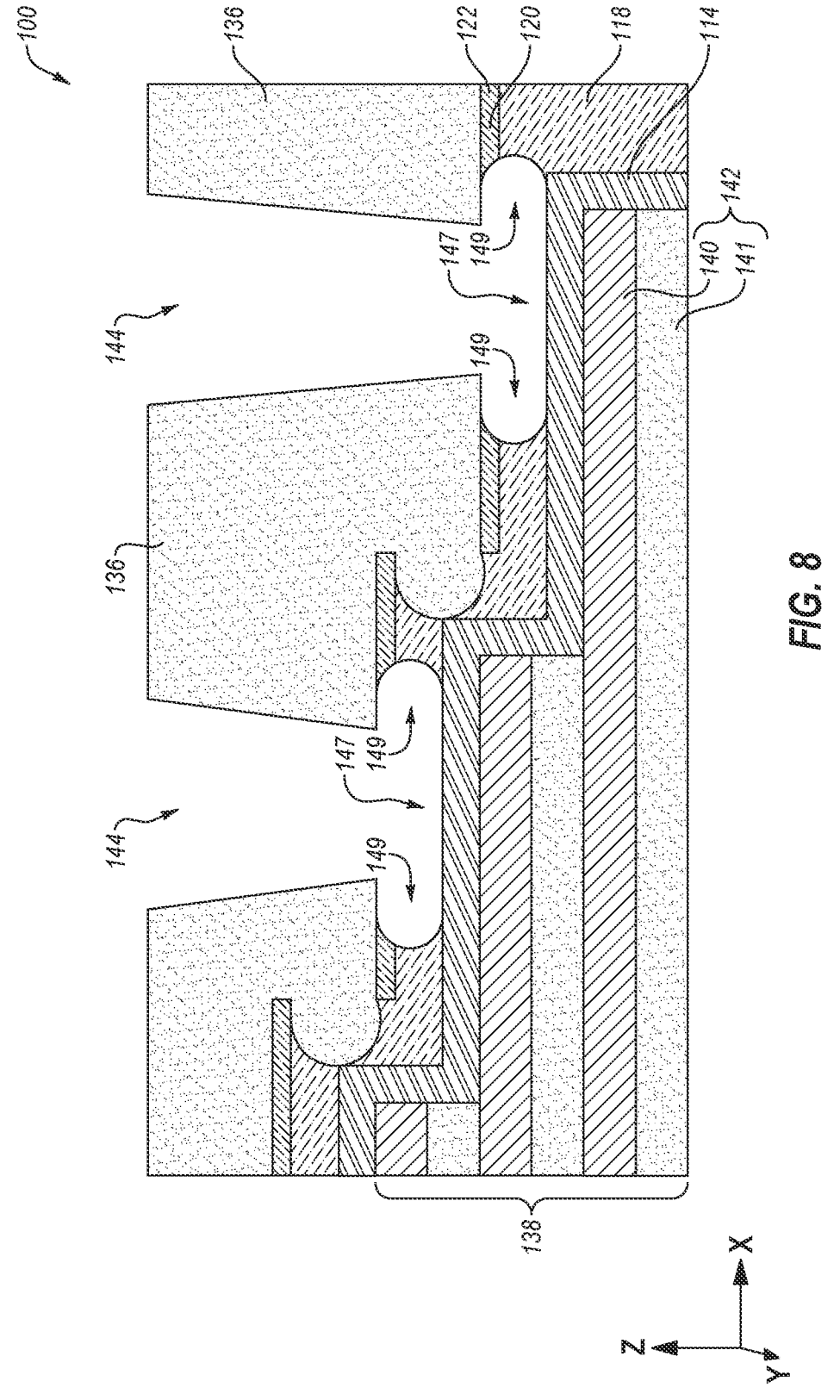

Referring next to FIG. 8, the second liner material 118 and the horizontally extending portions 122 of the doped second liner material 120 may be recessed vertically in the Z direction and horizontally in the Y-direction and the X-direction relative to a bottom boundary 145 (FIG. 7) (e.g., lower vertical boundary, lower end) of the initial contact openings 144 to form openings 147. For example, portions of the second liner material 118 and portions of the horizontally extending portions 122 of the doped second liner material 120 vertically beneath and horizontally adjacent to the initial contact openings 144 over the steps 112 of the staircase structure 110 may be removed to horizontally recess the second liner material 118 and the horizontally extending portions 122 of the doped second liner material 120 relative to the initial contact openings 144 and to expose portions of the first liner material 114 beneath the initial contact openings 144.

In some embodiments, the openings 147 extend horizontally (e.g., in the Y-direction and the X-direction) beyond horizontal boundaries of the initial contact openings 144 and into the second liner material 118 and the horizontally extending portions 122 beneath the isolation material 136 and above the first liner material 114. In some embodiments, during formation of the openings 147, the second liner material 118 and the horizontally extending portions 122 of the doped second liner material 120 are recessed in vertical and horizontal directions at substantially a 1:1 rate. In other words, the second liner material 118 and the horizontally extending portions 122 of the doped second liner material 120 may be recessed by substantially a same distance in vertical and horizontal directions. The openings 147 may define opposing recesses 149 in the second liner material 118 and the horizontally extending portions 122 of the doped second liner material 120. In some embodiments, the recesses 149 form a single recess that extends radially outward from the initial contact openings 144 and extends into and out of the view depicted in FIG. 8. Furthermore, the single recess may have a general annular shape. Additionally, the openings 147 may individually vertically extend down to and expose a portion of the first liner material 114 at an individual step 112 of the staircase structure 110 within the stack structure 138.

In some embodiments, an amount (e.g., a distance) the second liner material 118 and the horizontally extending portions 122 of the doped second liner material 120 are recessed in the Y-direction and the X-direction beyond the horizontal boundaries of the initial contact openings 144 (i.e., horizontal depths of the recesses 149 from the horizontal boundaries of the initial contact openings) determines a distance by which later-formed contact structures 148 (FIG. 12) are isolated from the second liner material 118 and the horizontally extending portions 122 of the doped second liner material 120.

The openings 147 may be formed by subjecting the microelectronic device structure 100 to an additional material removal process different than the material removal process employed to form the initial contact openings 144. As a non-limiting example, the contact openings 146 may be formed by subjecting portions of the second liner material 118 and the horizontally extending portions 122 of the doped second liner material 120 within horizontal areas of the initial contact openings 144 to an isotropic etch. In some embodiments, the material removal process may include a nitrogen trifluoride (NF₃) based plasma, vapor, and/or dry etch. Utilizing a nitrogen trifluoride (NF₃) based vapor and/or dry etch to form the openings 147 may result in substantially a same etch ratio within both relatively shallow initial contact openings 144 and relatively deep initial contact openings 144. In further embodiments, the material removal process may include exposing the second liner material 118 and the horizontally extending portions 122 of the doped second liner material 120 to one or more of a plasma including xenon difluoride (XeF₂), chlorine (Cl₂) (e.g., a mixture of Cl₂, nitrogen (N₂), and argon (Ar)), fluorine (F₂), carbon tetrafluoride (CF₄), hydrogen fluoride (HF), or another material. However, the disclosure is not so limited and the second liner material 118 and the horizontally extending portions 122 of the doped second liner material 120 may be removed by methods other than those described above.

Figure 9:
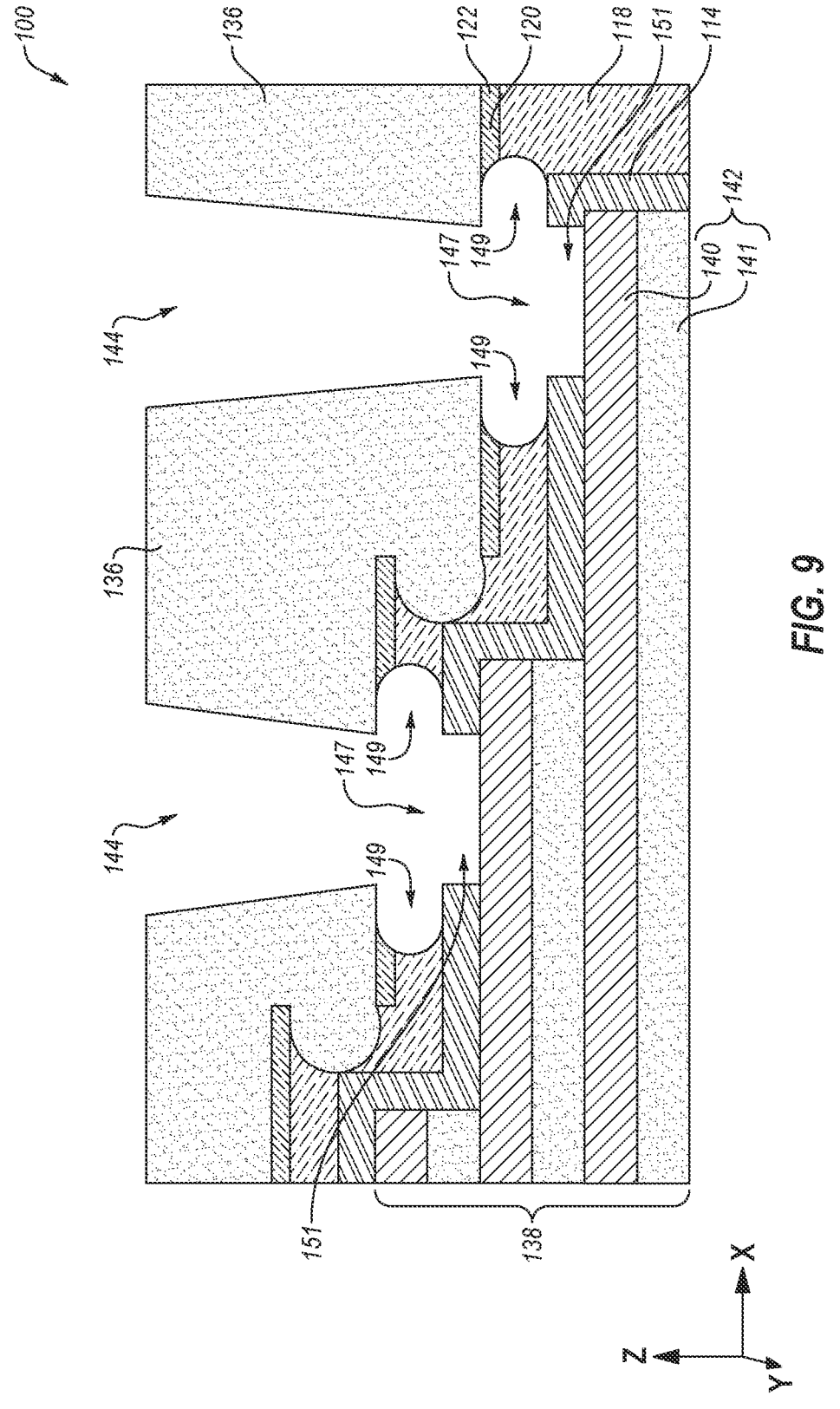

Referring next to FIG. 9, for each initial contact opening 144 and opening 147, a portion of the first liner material 114 within horizontal areas of the initial contact opening 144 may be removed to form an additional opening 151 and to expose a portion of the conductive structure 140 of an individual tier 142 of the stack structure 138 at an individual step 112 of the staircase structure 110 within the stack structure 138. The additional openings 151 may be formed by subjecting the microelectronic device structure 100 to an additional material removal process different than the material removal process employed to form the initial contact openings 144. As a non-limiting example, the additional openings 151 may be formed by subjecting portions of the first liner material 114 within horizontal areas of the initial contact openings 144 to a so-called "punch through" etch (e.g., a dry punch).

Figure 10:
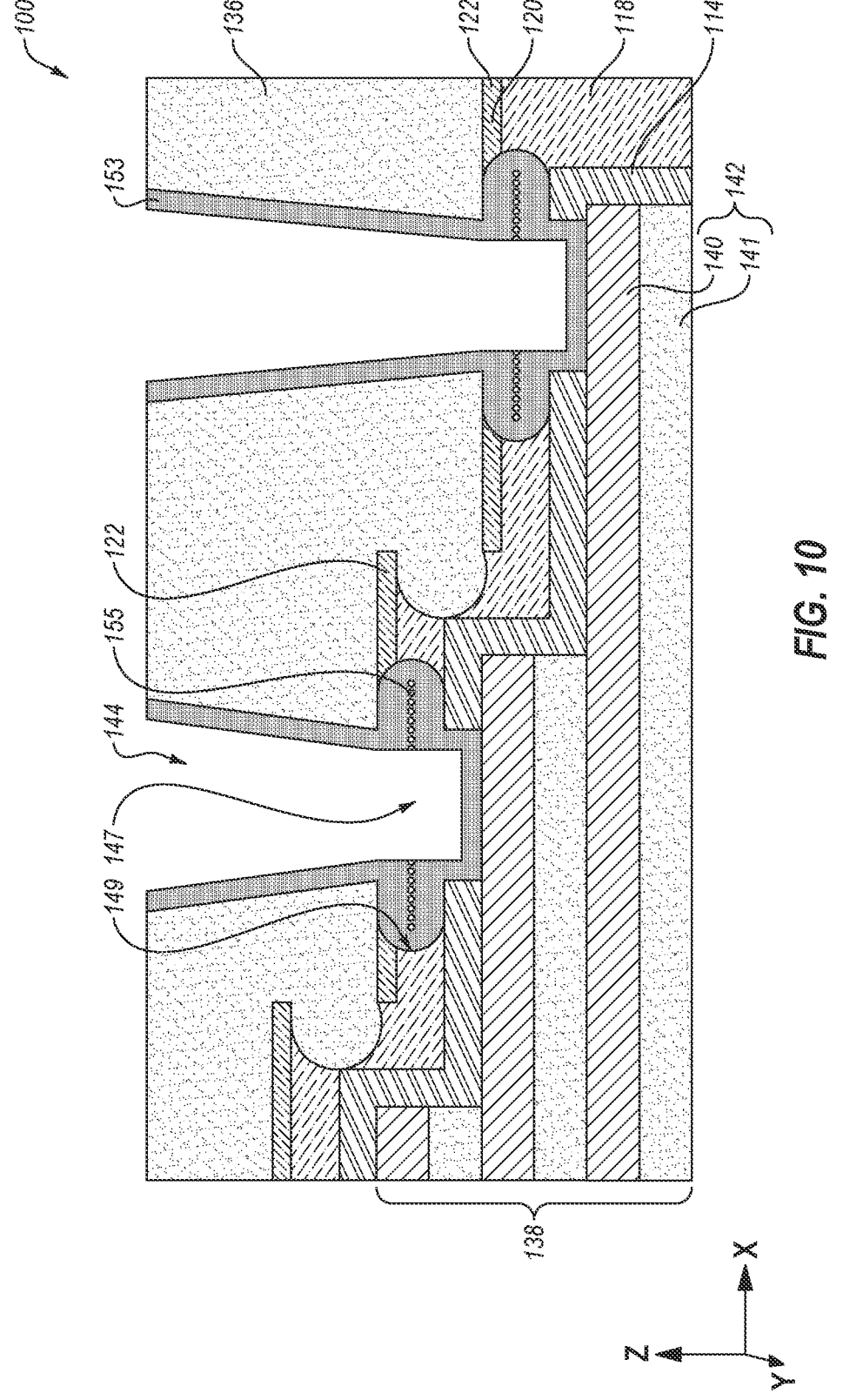

Referring now to FIG. 10, a barrier material 153 may be formed on or over exposed surfaces of the isolation material 136, the horizontally extending portions 122 of the doped second liner material 120, the second liner material 118, the first liner material 114, and the stack structure 138. For example, the barrier material 153 is formed on or over portions of the isolation material 136, the horizontally extending portions 122 of the doped second liner material 120, the second liner material 118, the first liner material 114, and the stack structure 138 defining the initial contact openings 144, openings 147 (FIG. 9), recesses 149, and additional openings 151 (FIG. 9). The barrier material 153 may at least partially (e.g., substantially) conform to a topography defined by the surfaces (e.g., horizontal surfaces, vertical surfaces) upon which the barrier material 153 is formed.

Forming the barrier material 153 on or over portions of the horizontally extending portions 122 of the doped second liner material 120 and the second liner material 118 defining the recesses 149 (e.g., forming the barrier material 153 over the structures defining the recesses 149) may form a seam structure 155 between two vertically adjacent portions of the barrier material 153 formed on vertically opposing surfaces defining a given recess 149. For example, the recesses 149 may not be completely filled with the barrier material 153 and voids may exist between vertically adjacent portions of the barrier material 153 formed on vertically opposing surfaces defining a given recess 149 and may define a given seam structure 155.

The barrier material 153 may comprise at least one oxygen-containing dielectric material, such as a one or more of a dielectric oxide material (e.g., $SiO_x$, phosphosilicate glass, borosilicate glass, borophosphosilicate glass, fluorosilicate glass, $AlO_x$, $HfO_x$, $NbO_x$, $TiO_x$), a dielectric oxynitride material (e.g., $SiO_xN_y$), and a dielectric carboxynitride material (e.g., $SiO_xC_zN_y$). In some embodiments, the barrier material 153 is formed of and includes $SiO_x$ (e.g., $SiO_2$). The barrier material 153 may be substantially homogeneous, or the barrier material 153 may be heterogeneous.

The barrier material 153 may be formed using a conventional processes (e.g., conventional conformal deposition processes, such as one or more of a conventional conformal CVD process and a conventional ALD process; conventional oxidation processes) and conventional processing equipment, which are not described in detail herein.

Figure 12:
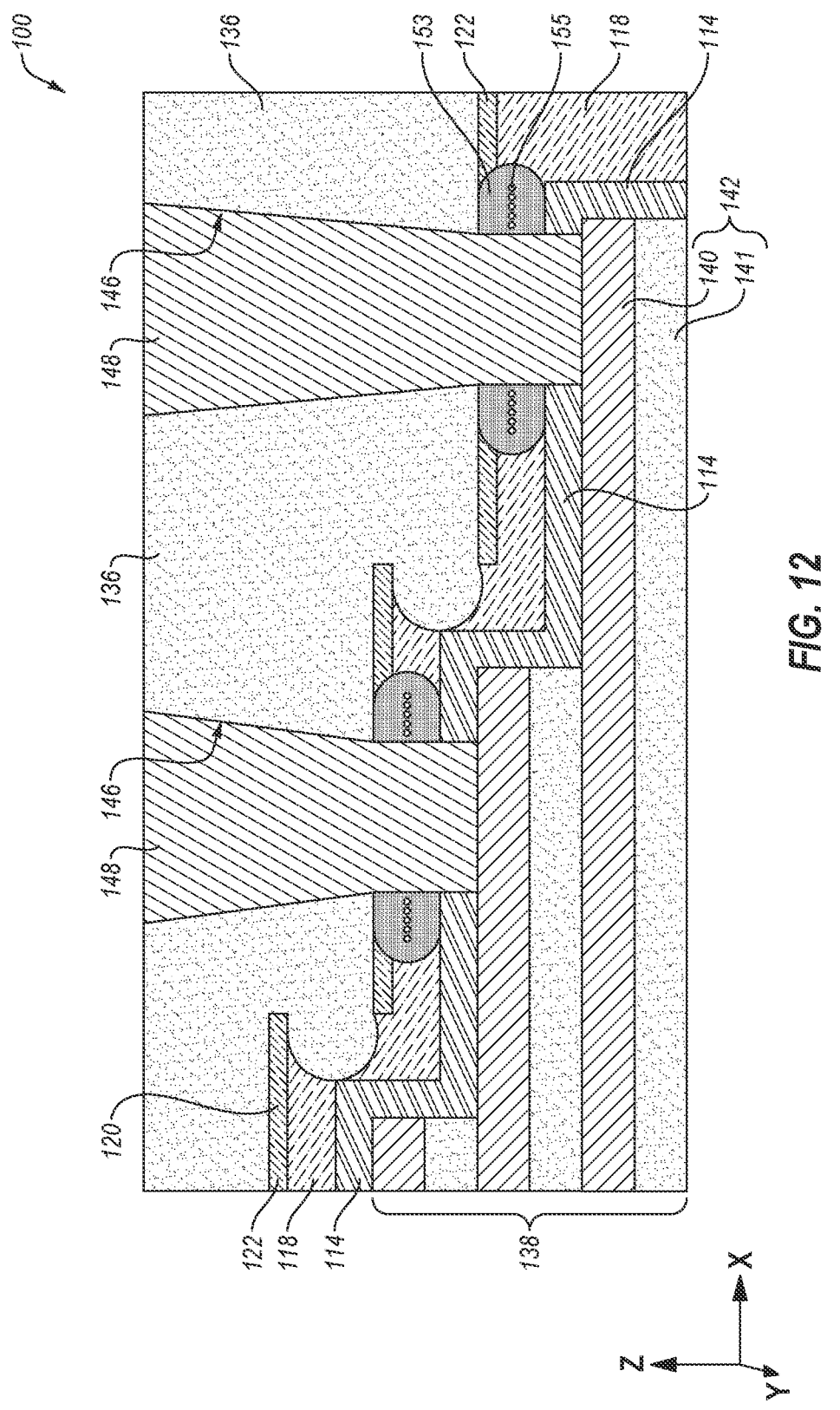

As is described in greater detail below, the barrier material 153 may serve as a barrier between the horizontally extending portions 122 of the doped second liner material 120 and the second liner material 118 and later-formed contact structures 148 (FIG. 12). For example, the barrier material 153 may at least substantially prevent the contact structures 148 from shorting on (e.g., creating a relatively low resistance connection with) the horizontally extending portions 122 of the doped second liner material 120 and/or the second liner material 118.

Figure 11:
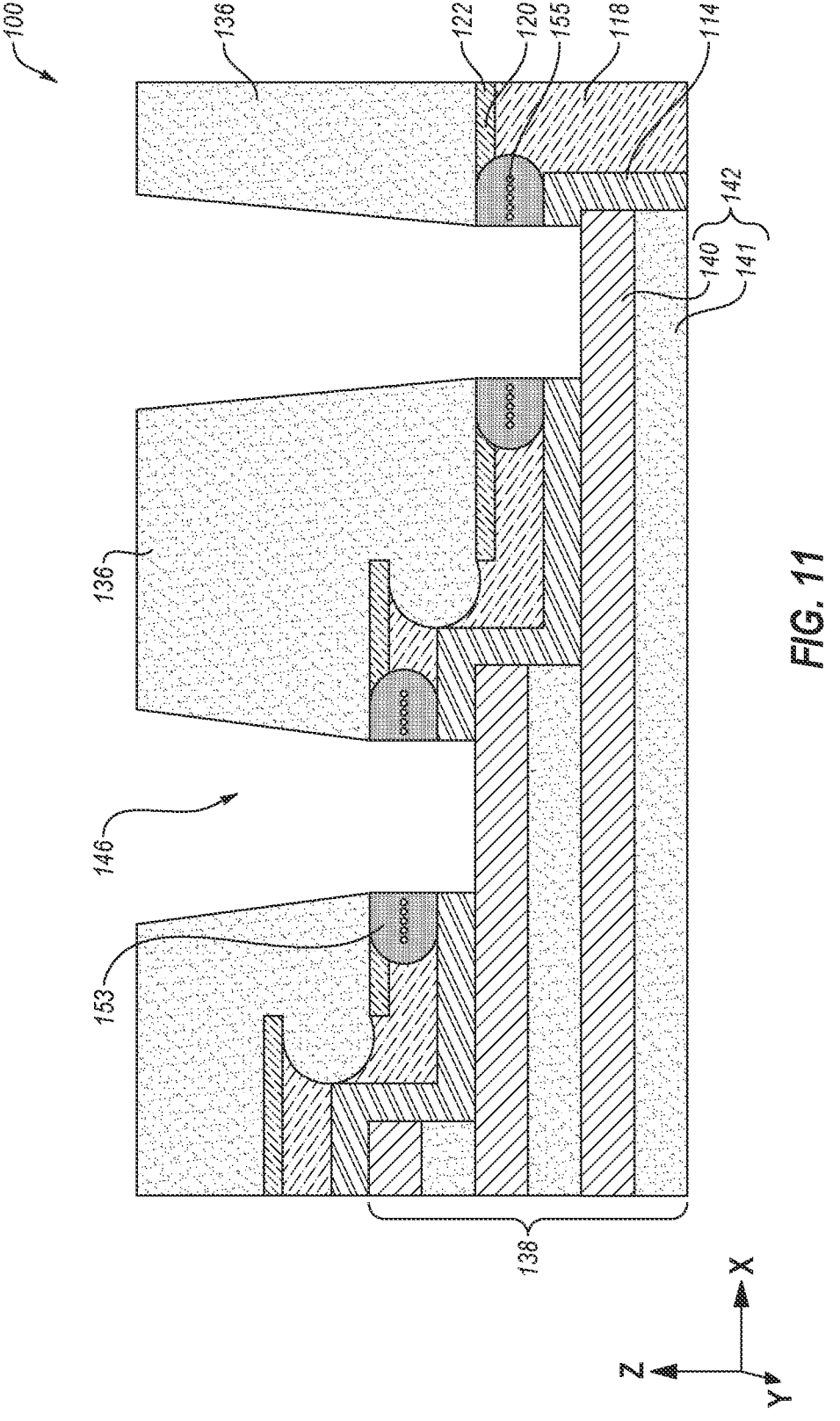

Referring next to FIG. 11, portions of the barrier material 153 may be removed to restore critical dimensions of the initial contact openings 144 (FIG. 9), expose the conductive structures 140 of the steps 112 of the staircase structure 110, and form the contact openings 146. For example, portions of the barrier material 153 lining the isolation material 136 and the upper conductive structures 140 of the steps 112 of the staircase structure 110 may be removed. Removing the portions of the barrier material 153 lining the isolation material 136 and the upper conductive structures 140 of the steps 112 of the staircase structure 110 may define at least one barrier structure within the recesses 149 (FIG. 10) defined in the second liner material 118 and the horizontally extending portions 122 of the doped second liner material 120. The barrier structure may comprise remaining (e.g., unremoved) portions of the barrier material 153. Furthermore, the at least one barrier structure may vertically span at least substantially the same tiers 142 of the stack structure 138 as the second liner material 118 and the horizontally extending portions 122 of the doped second liner material 120 (e.g., the liner structure). In some embodiments, each of the at least one barrier structure has a general annular shape and a general half-pill shaped cross-section.

In some embodiments, the portions of the barrier material 153 are removed without substantially removing the barrier material 153 through the seam structures 155. For example, the portions of the barrier material 153 may be removed while leaving portions of the seam structures 155 within the recesses 149 formed in the second liner material 118 and the horizontally extending portions 122 of the doped second liner material 120 at least substantially intact. The portions of the barrier material 153 may be removed through a removal process (e.g., an oxide vapor etch) that does not result in etchant entering the seam structures 155 in significant amounts and etching the barrier material 153 from the seam structures 155. In some embodiments, the portions of the barrier material 153 are selectively removed via one or more selective isotropic etching process. As a non-limiting example, the portions of the barrier material 153 are selectively removed and the contact openings are formed by exposing the barrier material 153 to one or more of hydrogen fluoride (HF) or ammonium fluorosilicate (AFS). As another non-limiting example, the portions of the barrier material 153 are selectively removed and the contact openings are formed by exposing the barrier material 153 to a so-called "punch through" etch.

Referring next to FIG. 12, contact structures 148 may be formed within the contact openings 146. The contact structures 148 may be substantially confined within boundaries (e.g., horizontal boundaries, vertical boundaries) of the contact openings 146, and may substantially fill the contact openings 146. Each contact structure 148 may have a geometric configuration (e.g., shape, dimensions) corresponding to (e.g., substantially the same as) a geometric configuration of the contact opening 146 filled with the contact structure 148. As shown in FIG. 12, each contact structure 148 may have an uppermost vertical boundary (e.g., an uppermost surface) substantially coplanar with an uppermost vertical boundary (e.g., an uppermost surface) of the isolation material 136, and a lowermost vertical boundary (e.g., a lowermost surface) vertically adjacent an uppermost vertical boundary (e.g., an uppermost surface) of the conductive structure 140 of an individual tier 142 of the stack structure 138. In additional embodiments, one or more (e.g., each) of the contact structures 148 may have an uppermost vertical boundary offset from (e.g., vertically over, vertically under) an uppermost vertical boundary (e.g., an uppermost surface) of the isolation material 136. Each contact structure 148 may individually contact (e.g., physically contact, electrically contact) the conductive structure 140 of the individual tier 142 of the stack structure 138 at an individual step 112 of an individual staircase structure 110 of the stack structure 138.

The contact structures 148 may be formed of and include conductive material. As a non-limiting example, the contact structures 148 may be formed of and include one or more of at least one metal, at least one alloy, and at least one conductive metal-containing material (e.g., a conductive metal nitride, a conductive metal silicide, a conductive metal carbide, a conductive metal oxide). A material composition of the contact structures 148 may be substantially the same as a material composition of the conductive structures 140 of the tiers 142 of the stack structure 138, or the material composition of the contact structures 148 may be different than the material composition of the conductive structures 140 of the tiers 142 of the stack structure 138. In some embodiments, the contact structures 148 are individually formed of and include W. The contact structures 148 may individually be homogeneous, or the contact structures 148 may individually be heterogeneous.

The contact structures 148 may be formed by forming (e.g., non-conformably depositing, such as through one or more of a PVD process and a non-conformal CVD process) conductive material inside and outside of the contact openings 146 (FIG. 11), and then removing (e.g., through an abrasive planarization process, such as a CMP process) portions of the conductive material overlying an uppermost vertical boundary (e.g., an uppermost surface) of the isolation material 136.

Referring to FIGS. 1A-12 together, the methods and structures described herein may be advantageous over conventional methods of forming microelectronic devices and conventional structures. For example, as noted above, the second liner material 118 and the horizontally extending portions 122 of the doped second liner material 120 (e.g., the liner structure) may serve as so-called "etch stop" structures to mitigate (e.g., prevent) undesirable damage (e.g., over-etching damage, punch-through damage) to the tiers 142 of the stack structure 138 during the formation of the initial contact openings 144.

Thus, in accordance with embodiments of the disclosure, a microelectronic device comprises a stack structure, a staircase structure, a first liner material, a liner structure, conductive contact structures, and barrier structures. The stack structure comprises vertically alternating conductive structures and insulative structures arranged in tiers. Each of the tiers individually comprises one of the conductive structures and one of the insulative structures. The staircase structure has steps comprising edges of at least some of the tiers of the stack structure. The first liner material is on the steps of the staircase structure. The liner structure is on the first liner material. The conductive contact structures extend through the liner material and the liner structure and to the conductive structures of the stack structure. The barrier structures are between the conductive contact structures and the liner structure and vertically spanning substantially the same tiers of the stack structure as the liner structure.

Furthermore, in accordance with embodiments of the disclosure, a method of forming a microelectronic device comprises forming a microelectronic device structure comprising a stack structure comprising a vertically alternating sequence of insulative material and sacrificial material arranged in tiers, and a staircase structure having steps comprising edges of at least some of the tiers of the stack structure. A first liner material is formed on the steps of the staircase structure. A second liner material is formed over the first liner material. An isolation material is formed over the second liner material. The sacrificial material of the tiers of the stack structure is at least partially replaced with conductive material. Initial contact openings are formed through the isolation material over each of the steps of the staircase structure and a portion of the second liner material over each of the steps of the staircase structure is exposed. Portions of the second liner material vertically beneath and horizontally adjacent to the initial contact openings over the steps of the staircase structure are removed to horizontally recess the second liner material relative to the initial contact openings and to expose portions of the first liner material beneath the initial contact openings. A barrier material is formed horizontally adjacent to horizontally recessed portions of the second liner material to form barrier structures.

The portions of the first liner material beneath the initial contact openings are removed to expose portions of the conductive material of the steps of the staircase structure. Conductive contact structures are formed to vertically extend through the first liner material and to portions of the conductive material at the steps of the staircase structure, the barrier structure isolating the conductive contact structures from the second liner material.

Figure 13:
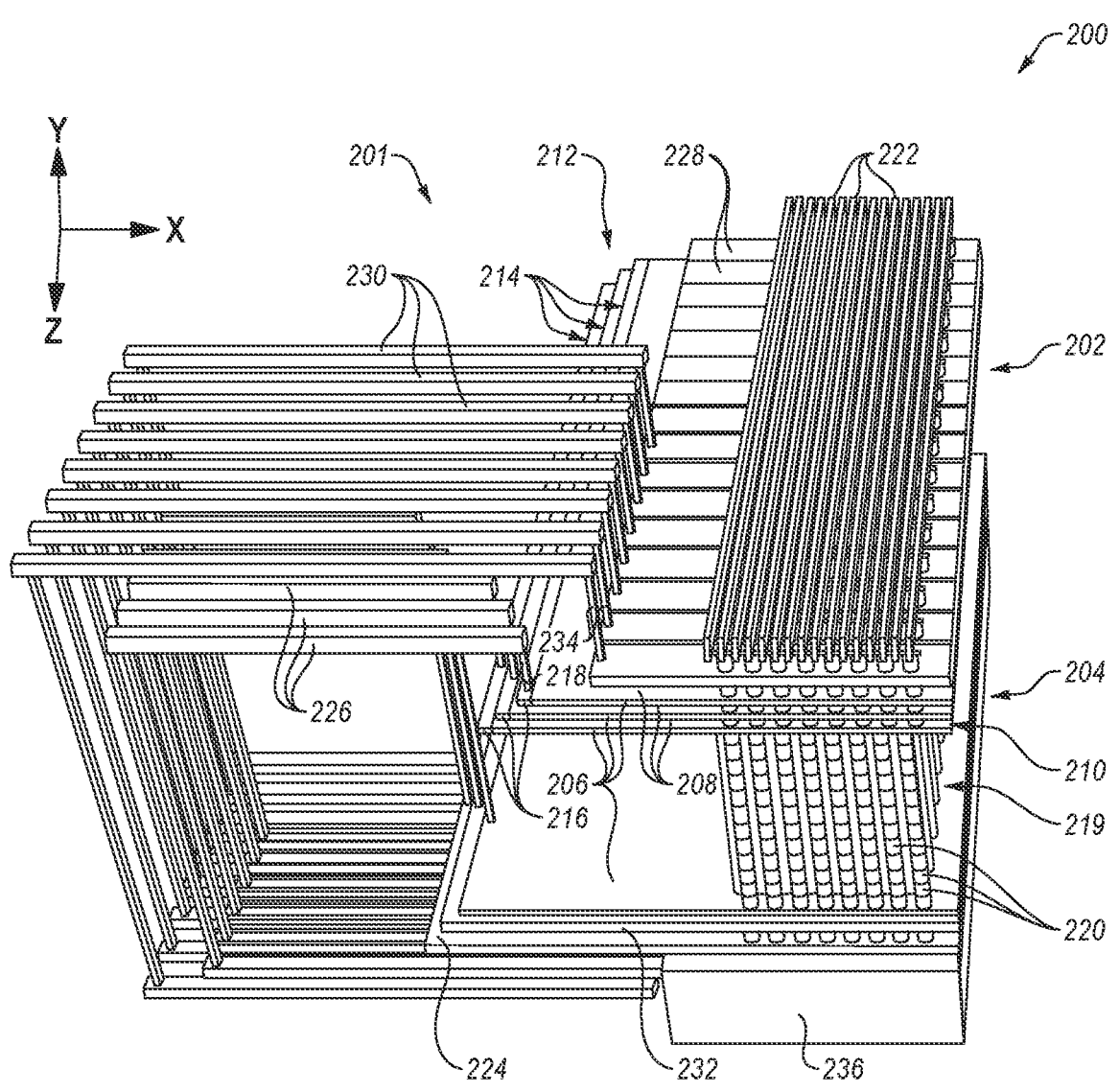
FIG. 13 is a partial cutaway perspective view of a microelectronic device, in accordance with embodiments of the disclosure.

Microelectronic device structures (e.g., the microelectronic device structure 100 previously described with reference to FIG. 12) of the disclosure may be included in microelectronic devices of the disclosure. For example, FIG. 13 illustrates a partial cutaway perspective view of a portion of a microelectronic device 200 (e.g., a memory device, such as a 3D NAND Flash memory device) including a microelectronic device structure 202. The microelectronic device structure 202 may be substantially similar to the microelectronic device structure 100 at the processing stage previously described with reference to FIG. 12. In some embodiments, the microelectronic device structure 202 is formed through the processes previously described with reference to FIGS. 1A through 12.

As shown in FIG. 13, the microelectronic device structure 202 may include a stack structure 204 including a vertically alternating (e.g., in the Z-direction) sequence of conductive structures 206 and insulative structures 208 arranged in tiers 210; a staircase structure 212 having steps 214 defined by edges (e.g., horizontal ends in the X-direction) of the tiers 210; composite pad structures 216 on portions of the tiers 210 of the stack structure 204 at the steps 214 of the staircase structure 212; and conductive contact structures 218 extending through the composite pad structures 216 and contacting (e.g., physically contacting, electrically contacting) to the conductive structures 206 of the tiers 210 of the stack structure 204 at the steps 214 of the staircase structure 212. The stack structure 204, the conductive structures 206, the insulative structures 208, the tiers 210, the staircase structure 212, the steps 214, the composite pad structures 216, and the conductive contact structures 218 may respectively be substantially similar to the stack structure 138, the conductive structures 140, the insulative structures 141, the tiers 142, the staircase structure 110, the steps 112, the horizontally, and the contact structures 148 previously described with reference to FIG. 12. The microelectronic device 200 also includes additional features (e.g., structures, devices) operatively associated with the microelectronic device structure 202, as described in further detail below.

The microelectronic device 200 may further include vertical strings 219 of memory cells 220 coupled to each other in series, digit line structures 222 (e.g., bit line structures), a source structure 224, access line routing structures 226, first select gates 228 (e.g., upper select gates, drain select gates (SGDs)), select line routing structures 230, second select gates 232 (e.g., lower select gates, source select gates (SGSs)), and additional contact structures 234. The vertical strings 219 of memory cells 220 extend vertically and orthogonal to conductive lines and tiers (e.g., the digit line structures 222, the source structure 224, the tiers 210 of the stack structure 204, the access line routing structures 226, the first select gates 228, the select line routing structures 230, the second select gates 232). In some embodiments, the memory cells 220 comprise so-called "MONOS" (metal-oxide-nitride-oxide-semiconductor) memory cells. In additional embodiments, the memory cells 220 comprise so-called "TANOS" (tantalum nitride-aluminum oxide-nitride-oxide-semiconductor) memory cells, or so-called "BETANOS" (band/barrier engineered TANOS) memory cells, each of which are subsets of MONOS memory cells. In further embodiments, the memory cells 220 comprise so-called "floating gate" memory cells. The conductive contact structures 218 and the additional contact structures 234 may electrically couple components to each other as shown (e.g., the select line routing structures 230 to the first select gates 228, the access line routing structures 226 to the tiers 210 of the stack structure 204 of the microelectronic device structure 202).

The microelectronic device 200 may also include a base structure 236 positioned vertically below the vertical strings 219 of memory cells 220. The base structure 236 may include at least one control logic region including control logic devices configured to control various operations of other features (e.g., the vertical strings 219 of memory cells 220) of the microelectronic device 200. As a non-limiting example, the control logic region of the base structure 236 may further include one or more (e.g., each) of charge pumps (e.g., $V_{CCP}$ charge pumps, $V_{NEGWL}$ charge pumps, DVC2 charge pumps), delay-locked loop (DLL) circuitry (e.g., ring oscillators), $V_{dd}$ regulators, drivers (e.g., string drivers), page buffers, decoders (e.g., local deck decoders, column decoders, row decoders), sense amplifiers (e.g., equalization (EQ) amplifiers, isolation (ISO) amplifiers, NMOS sense amplifiers (NSAs), PMOS sense amplifiers (PSAs)), repair circuitry (e.g., column repair circuitry, row repair circuitry), I/O devices (e.g., local I/O devices), memory test devices, MUX, error checking and correction (ECC) devices, self-refresh/wear leveling devices, and other chip/deck control circuitry. The control logic region of the base structure 236 may be coupled to the source structure 224, the access line routing structures 226, the select line routing structures 230, and the digit line structures 222. In some embodiments, the control logic region of the base structure 236 includes CMOS (complementary metal-oxide-semiconductor) circuitry. In such embodiments, the control logic region of the base structure 236 may be characterized as having a "CMOS under Array" ("CuA") configuration.

Thus, in accordance with embodiments of the disclosure, a memory device comprises a stack structure, a staircase structure, a first liner material, a second liner material, conductive contact structures, barrier structures, digit line structures, a source structure, strings of memory cells, access line routing structures, and a control logic circuitry. The stack structure comprises tiers each comprising a conductive structure and an insulative structure vertically adjacent the conductive structure. The staircase structure has steps comprising edges of at least some of the tiers of the stack structure. The first liner material is on the steps of the staircase structure and partially defines boundaries of filled contact openings over each step of the staircase structure. The second liner material is on the first liner material, comprises a semiconductive material, and has at least one doped portion. The second liner is horizontally spaced apart from horizontal boundaries of the first liner material partially defining the boundaries of the filled contact openings. The conductive contact structures are within the boundaries of the filled contact openings and vertically extend to portions of at least some of the conductive structures of the stack structure at the steps of the staircase structure. The barriers structures are between the second liner material and the conductive contact structures and electrically isolate the second liner material from the conductive contact structures. The digit line structures overlie the stack structure. The source structure underlies the stack structure. The strings of memory cells extend vertically through the stack structure and are coupled to the source structure and the digit line structures. The access line routing structures are coupled to the conductive contact structures. The control logic circuitry vertically underlies the source structure and is within horizontal boundaries of the array of vertically extending strings of memory cells. The control logic circuitry is electrically coupled to the source structure, the digit line structures, and the access line routing structures.

Microelectronic device structures (e.g., the microelectronic device structure 100 previously described with reference to FIG. 12) and microelectronic devices (e.g., the microelectronic device 200 previously described with reference to FIG. 13) in accordance with embodiments of the disclosure may be used in embodiments of electronic systems of the disclosure. An electronic system may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system includes at least one memory device. The memory device may comprise, for example, an embodiment of one or more of a microelectronic device structure and a microelectronic device previously described herein. The electronic system may further include at least one electronic signal processor device (often referred to as a "microprocessor"). The electronic signal processor device may, optionally, include an embodiment of one or more of a microelectronic device structure and a microelectronic device previously described herein. While the memory device and the electronic signal processor device may be two (2) separate devices, in additional embodiments, a single (e.g., only one) memory/processor device having the functionalities of the memory device and the electronic signal processor device is included in the electronic system. In such embodiments, the memory/processor device may include one or more of a microelectronic device structure and a microelectronic device previously described herein. The electronic system may further include one or more input devices for inputting information into the electronic system by a user, such as, for example, a mouse or other pointing device, a keyboard, a touchpad, a button, or a control panel. The electronic system may further include one or more output devices for outputting information (e.g., visual or audio output) to a user such as, for example, one or more of a monitor, a display, a printer, an audio output jack, and a speaker. In some embodiments, the input device and the output device may comprise a single touchscreen device that can be used both to input information to the electronic system and to output visual information to a user. The input device and the output device may communicate electrically with one or more of the memory device and the electronic signal processor device.

Thus, in accordance with embodiments of the disclosure, an electronic system comprises an input device, an output device, a processor device operably coupled to the input device and the output device, and a memory device operably coupled to the processor device. The memory device comprises a microelectronic device structure comprising a stack structure, a staircase structure, liner materials, and conductive contact structures. The stack structure comprises tiers each comprising a conductive structure, and an insulative structure vertically neighboring the conductive structure. The staircase structure is within the stack structure and has steps comprising edges of at least some of the tiers. The liner materials are over the staircase structure, and at least one of the liner materials has a different material composition than at least one other of the liner materials. The conductive contact structures extend through the liner materials and to at least some of the steps of the staircase structure. The conductive contact structures are spaced apart from the at least one of the liner materials by barrier structures.

The methods, structures (e.g., the microelectronic device structure 100), devices (e.g., the microelectronic device 200), and systems (e.g., the electronic system) of the disclosure advantageously facilitate one or more of improved performance, reliability, and durability, lower costs, increased miniaturization of components, improved pattern quality, and greater packaging density as compared to conventional structures, conventional devices, and conventional systems. The methods and structures of the disclosure may alleviate problems related to the formation and processing of conventional microelectronic devices including stack structures having staircase structures at edges thereof. For example, the methods and structures of the disclosure may reduce the risk of undesirable damage (e.g., contact structure punch through) to conductive structures (e.g., the conductive structures 140) of stack structures (e.g., the stack structure 138) at steps (e.g., the steps 112) of staircase structures (e.g., the staircase structure 110), as well as undesirable current leakage and short circuits as compared to conventional methods and conventional structures.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalents.

What is claimed is:

1. A microelectronic device, comprising:
a stack structure comprising vertically alternating conductive structures and insulative structures arranged in tiers, each of the tiers individually comprising one of the conductive structures and one of the insulative structures;
a staircase structure having steps comprising edges of at least some of the tiers of the stack structure;
a first liner material on the steps of the staircase structure;
a liner structure on the first liner material and comprising:
a second liner material on the first liner material and comprising a semiconductive material; and
a doped semiconductive material on the second liner material;
conductive contact structures extending through the first liner material and the liner structure and to the conductive structures of the stack structure; and
barrier structures between the conductive contact structures and the liner structure, the barrier structures vertically spanning substantially the same tiers of the stack structure as the liner structure.

2. The microelectronic device of claim 1, wherein the doped semiconductive material of the liner structure comprises polycrystalline silicon doped with one or more of C, B, P, As, Sb, Bi, Al, Ga, N, O, F, Cl, Br, H, $^2$H, He, Ne, and Ar.

3. The microelectronic device of claim 1, wherein the doped semiconductive material of the liner structure comprises polycrystalline silicon doped with B.

4. A microelectronic device, comprising:
a stack structure comprising vertically alternating conductive structures and insulative structures arranged in tiers, each of the tiers individually comprising one of the conductive structures and one of the insulative structures;
a staircase structure having steps comprising edges of at least some of the tiers of the stack structure;
a first liner material on the steps of the staircase structure;
a liner structure on the first liner material;
conductive contact structures in contact with the first liner material, the conductive contact structures extending through the first liner material and the liner structure and to the conductive structures of the stack structure; and
barrier structures between the conductive contact structures and the liner structure, the barrier structures vertically spanning substantially the same tiers of the stack structure as the liner structure.

5. A microelectronic device, comprising:
a stack structure comprising vertically alternating conductive structures and insulative structures arranged in tiers, each of the tiers individually comprising one of the conductive structures and one of the insulative structures;
a staircase structure having steps comprising edges of at least some of the tiers of the stack structure;
a first liner material on the steps of the staircase structure;
a liner structure on the first liner material;
conductive contact structures extending through the first liner material and the liner structure and to the conductive structures of the stack structure; and
barrier structures between the conductive contact structures and the liner structure, the barrier structures vertically spanning substantially the same tiers of the stack structure as the liner structure, each of the barrier structures individually comprising two vertically adjacent portions with a seam formed therebetween.

6. The microelectronic device of claim 1, wherein each of the barrier structures individually horizontally overlaps one of the steps of the staircase structure.

7. The microelectronic device of claim 1, wherein the first liner material comprises a dielectric oxide material.

8. A method of forming a microelectronic device, comprising:
forming a microelectronic device structure, the microelectronic device structure comprising:
a stack structure comprising a vertically alternating sequence of insulative material and sacrificial material arranged in tiers; and
a staircase structure having steps comprising edges of at least some of the tiers of the stack structure;
forming a first liner material on the steps of the staircase structure;
forming a liner structure on the first liner material, the liner structure comprising:
a second liner material on the first liner material and comprising a semiconductive material; and
a doped semiconductive material on the second liner material;
forming an isolation material over the second liner material;
at least partially replacing the sacrificial material of the tiers of the stack structure with conductive material;
forming initial contact openings through the isolation material over each of the steps of the staircase structure and exposing a portion of the second liner material over each of the steps of the staircase structure;
removing portions of the second liner material vertically beneath and horizontally adjacent to the initial contact openings over the steps of the staircase structure to horizontally recess the second liner material relative to the initial contact openings and to expose portions of the first liner material beneath the initial contact openings;

forming a barrier material horizontally adjacent to horizontally recessed portions of the second liner material to form barrier structures, the barrier structures vertically spanning substantially the same tiers of the stack structure as the liner structure;

removing the portions of the first liner material beneath the initial contact openings and exposing portions of the conductive material of the steps of the staircase structure; and forming conductive contact structures vertically extending through the first liner material and to portions of the conductive material at the steps of the staircase structure, the barrier structures isolating the conductive contact structures from the second liner material.

9. The method of claim 8, wherein forming a second liner material over the first liner material comprises doping at least a portion of the second liner material.

10. The method of claim 9, wherein doping at least a portion of the second liner material comprises doping the second liner material with one or more of C and B.

11. The method of claim 9, wherein doping at least a portion of the second liner material comprises doping only a portion of the second liner material.

12. The method of claim 9, wherein doping at least a portion of the second liner material comprises doping at least substantially an entire vertical thickness of multiple portions of the second liner material.

13. The method of claim 8, wherein removing portions of the second liner material vertically beneath and horizontally adjacent to the initial contact openings over the steps of the staircase structure comprises subjecting the second liner material to an isotropic etch.

14. The method of claim 8, wherein removing portions of the second liner material vertically beneath and horizontally adjacent to the initial contact openings over the steps of the staircase structure comprises exposing the second liner material to one or more of an $NF_3$-based plasma etch, a vapor etch, and a dry etch.

15. The method of claim 8, wherein forming a barrier material comprises forming an oxide liner over the recessed portions of the second liner material to form two vertically adjacent portions of the barrier material with a seam structure therebetween.

16. The method of claim 8, wherein forming the barrier material comprises:

forming the barrier material over the initial contact openings; and removing portions of the barrier material not lining recessed portions of the second liner material.

17. A memory device, comprising:

a stack structure comprising tiers each comprising a conductive structure and an insulative structure vertically adjacent the conductive structure;

a staircase structure having steps comprising edges of at least some of the tiers of the stack structure;

a first liner material on the steps of the staircase structure and partially defining boundaries of filled contact openings over each step of the staircase structure;

a second liner material on the first liner material, the second liner material comprising a semiconductive material and having at least one doped portion, the second liner material being horizontally spaced apart from horizontal boundaries of the first liner material partially defining the boundaries of the filled contact openings;

conductive contact structures within the boundaries of the filled contact openings and vertically extending to portions of at least some of the conductive structures of the stack structure at the steps of the staircase structure;

barrier structures between the second liner material and the conductive contact structures and electrically isolating the second liner material from the conductive contact structures; and strings of memory cells vertically extending through the stack structure.

18. The memory device of claim 17, wherein the second liner material has a maximum vertical thickness less than or equal to about 50 nm.

19. The memory device of claim 17, wherein the barrier structures comprise dielectric oxide material.

20. The memory device of claim 17, wherein horizontal boundaries of at least some of the barrier structures are horizontally aligned with the horizontal boundaries of the first liner material partially defining the boundaries of the filled contact openings.

21. The memory device of claim 17, wherein each barrier structure of the barrier structures has a substantially annular horizontal cross-sectional shape.

22. The memory device of claim 17, further comprising:

digit line structures overlying the stack structure and coupled to the strings of memory cells;

a source structure underlying the stack structure and coupled to the strings of memory cells;

access line routing structures coupled to the conductive contact structures; and control logic circuitry vertically underlying the source structure and within horizontal boundaries of an array of vertically extending strings of memory cells, the control logic circuitry coupled to the source structure, the digit line structures, and the access line routing structures.

23. An electronic system, comprising:

an input device;

an output device;

a processor device operably coupled to the input device and the output device; and a memory device operably coupled to the processor device and comprising at least one microelectronic device structure comprising:

a stack structure comprising tiers each comprising:

a conductive structure; and an insulative structure vertically neighboring the conductive structure;

a staircase structure within the stack structure and having steps comprising edges of at least some of the tiers of the stack structure;

a first liner material on the steps of the staircase structure;

a liner structure on the first liner material, at least substantially an entirety of the liner structure comprises a doped semiconductive material;

conductive contact structures extending through the first liner material and the liner structure and to the conductive structure of respective ones of the steps of the stack structure; and barrier structures between the conductive contact structures and the liner structure, the barrier structures vertically spanning substantially the same tiers of the stack structure as the liner structure.

* * * * *